(12) United States Patent
Yamazaki et al.

(10) Patent No.: US 8,101,467 B2
(45) Date of Patent: Jan. 24, 2012

(54) LIQUID CRYSTAL DISPLAY DEVICE AND METHOD FOR MANUFACTURING THE SAME, AND LIQUID CRYSTAL TELEVISION RECEIVER

(75) Inventors: Shunpei Yamazaki, Tokyo (JP); Shinji Maekawa, Shizuoka (JP); Makoto Furuno, Kanagawa (JP); Osamu Nakamura, Kanagawa (JP); Keitaro Imai, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 591 days.

(21) Appl. No.: 10/574,829

(22) PCT Filed: Oct. 25, 2004

(86) PCT No.: PCT/JP2004/016183
§ 371 (c)(1),
(2), (4) Date: Apr. 6, 2006

(87) PCT Pub. No.: WO2005/041311
PCT Pub. Date: May 6, 2005

(65) Prior Publication Data
US 2007/0051952 A1 Mar. 8, 2007

(30) Foreign Application Priority Data
Oct. 28, 2003 (JP) ................. 2003-368166

(51) Int. Cl.
*H01L 21/00* (2006.01)
(52) U.S. Cl. .......... 438/121; 428/149; 445/50; 445/51

(58) Field of Classification Search ............. 445/51, 445/50, 58; 438/121, 149, 151, 789
See application file for complete search history.

(56) References Cited

U.S. PATENT DOCUMENTS 5,947,783 A * 9/1999 Bojkov et al. ............ 445/51
5,989,945 A 11/1999 Yudasaka et al.
6,291,136 B1 9/2001 Masutani et al.
(Continued)

FOREIGN PATENT DOCUMENTS
EP 0 855 614 A1 7/1998
(Continued)

OTHER PUBLICATIONS

K.K. Caswell et al., "Preferential End-to-End assembly of Gold Nanorods by Blotin-Streptavidin Connectors", Oct. 2003, JACS Communications, J.Am.Chem.Soc. 2003,125,13914-13915.*

(Continued)

*Primary Examiner* — Howard Weiss
*Assistant Examiner* — Steven H Rao
(74) *Attorney, Agent, or Firm* — Nixon Peabody LLP; Jeffrey L. Costellia

(57) ABSTRACT

At least one or more of a conductive layer which forms a wiring or an electrode and a pattern necessary for manufacturing a display panel such as a mask for forming a predetermined pattern is formed by a method capable of selectively forming a pattern to manufacture a liquid crystal display device. A droplet discharge method capable of forming a predetermined pattern by selectively discharging a droplet of a composition in accordance with a particular object is used as a method capable of selectively forming a pattern in forming a conductive layer, an insulating layer, or the like.

20 Claims, 28 Drawing Sheets

U.S. PATENT DOCUMENTS

| | | |
|---|---|---|
| 6,294,401 B1 | 9/2001 | Jacobson et al. |
| 6,441,945 B1 * | 8/2002 | Atwater et al. ............... 359/296 |
| 6,593,591 B2 | 7/2003 | Yudasaka et al. |
| 6,715,871 B2 | 4/2004 | Hashimoto et al. |
| 6,849,308 B1 | 2/2005 | Speakman et al. |
| 2002/0044111 A1 | 4/2002 | Yamazaki et al. |
| 2002/0074547 A1 | 6/2002 | Yudasaka et al. |
| 2002/0100908 A1 | 8/2002 | Yudasaka et al. |
| 2002/0179906 A1 | 12/2002 | Yudasaka et al. |
| 2003/0054653 A1 | 3/2003 | Yamazaki et al. |
| 2003/0134519 A1 | 7/2003 | Yudasaka et al. |
| 2004/0147113 A1 | 7/2004 | Yamazaki et al. |
| 2005/0074963 A1 | 4/2005 | Fujii et al. |
| 2006/0073667 A1 | 4/2006 | Li et al. |
| 2007/0051958 A1 | 3/2007 | Yamazaki et al. |
| 2007/0098883 A1 * | 5/2007 | Itoh et al. ...................... 427/180 |
| 2009/0091762 A1 * | 4/2009 | Ueno et al. .................... 356/445 |

FOREIGN PATENT DOCUMENTS

| | | |
|---|---|---|
| EP | 1 163 552 B1 | 8/2003 |
| EP | 1 445 793 A2 | 8/2004 |
| EP | 1 450 412 A2 | 8/2004 |
| JP | 04-056168 | 2/1992 |
| JP | 07-297404 | 11/1995 |
| JP | 10-270843 | 10/1998 |
| JP | 11-326951 | 11/1999 |
| JP | 2000-029053 | 1/2000 |
| JP | 2002-049333 | 2/2002 |
| JP | 2002-359246 | 12/2002 |
| JP | 2003-506886 | 2/2003 |
| JP | 2003-098548 | 4/2003 |
| JP | 2003-258226 | 9/2003 |
| JP | 2003-080694 | 4/2011 |
| WO | WO 97/43689 | 11/1997 |
| WO | WO 01/11426 A1 | 2/2001 |

OTHER PUBLICATIONS

International Search Report of Application No. PCT/JP2004/016183; PCT7465) Dated Dec. 7, 2004.

Written Opinion (Application No. PCT/JP2004/016183; PCT7465) Dated Dec. 7, 2004.

* cited by examiner

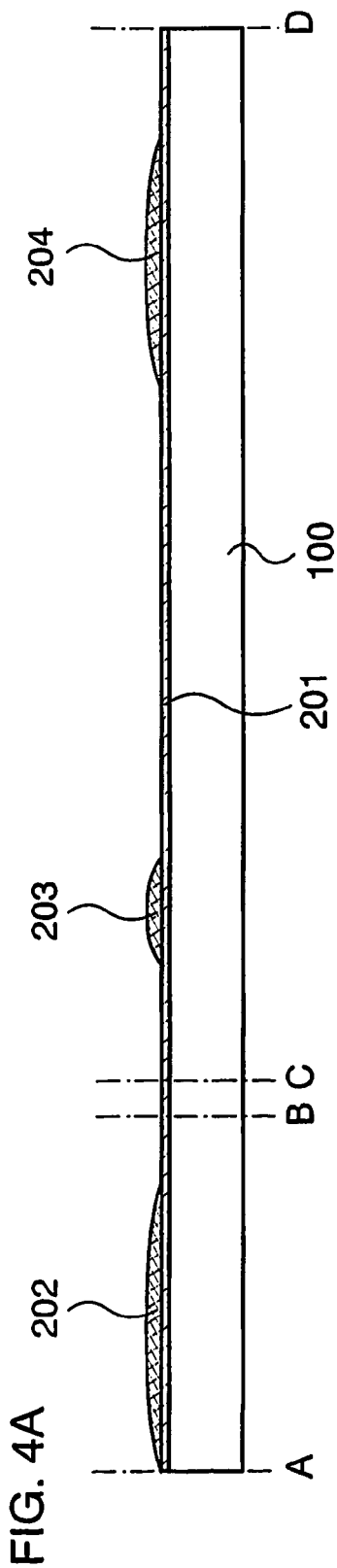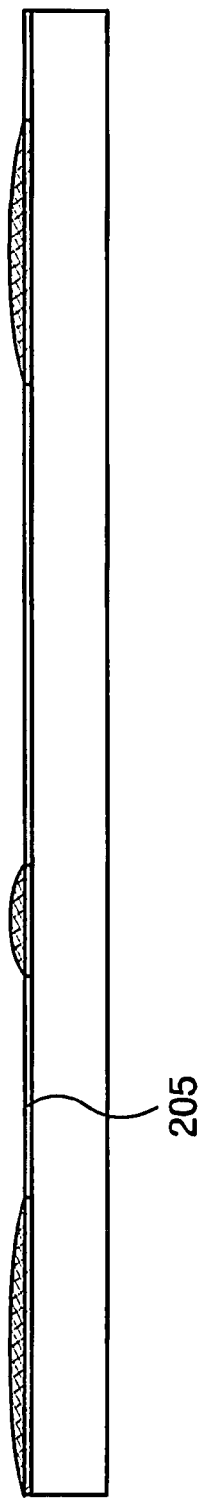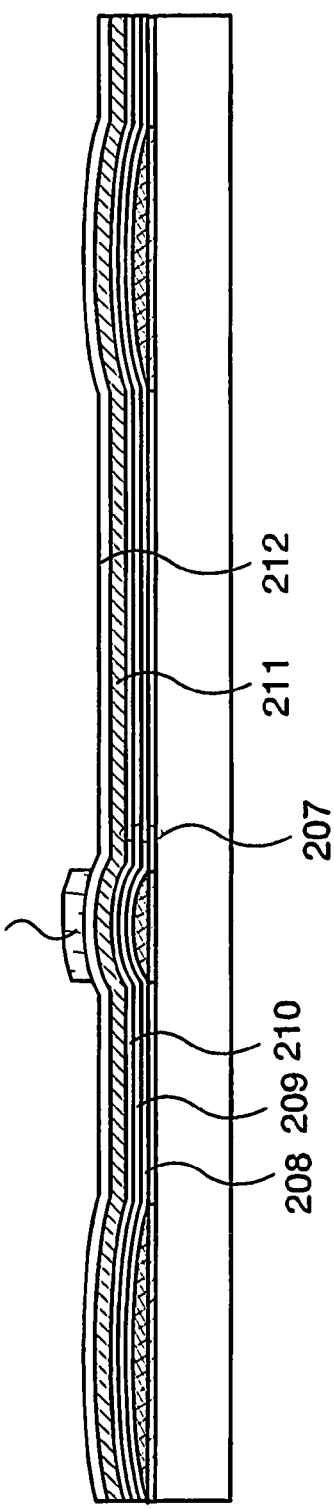

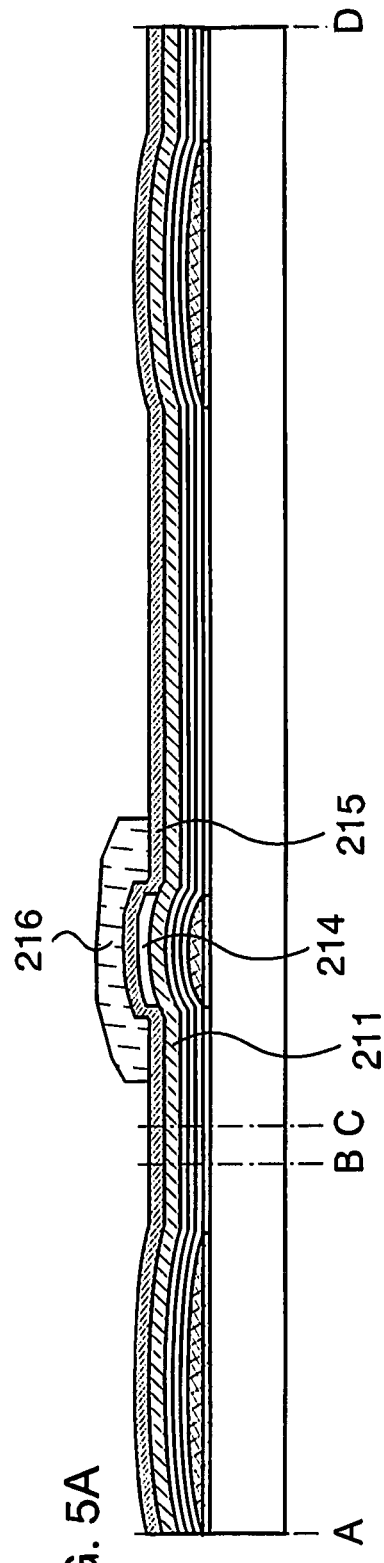
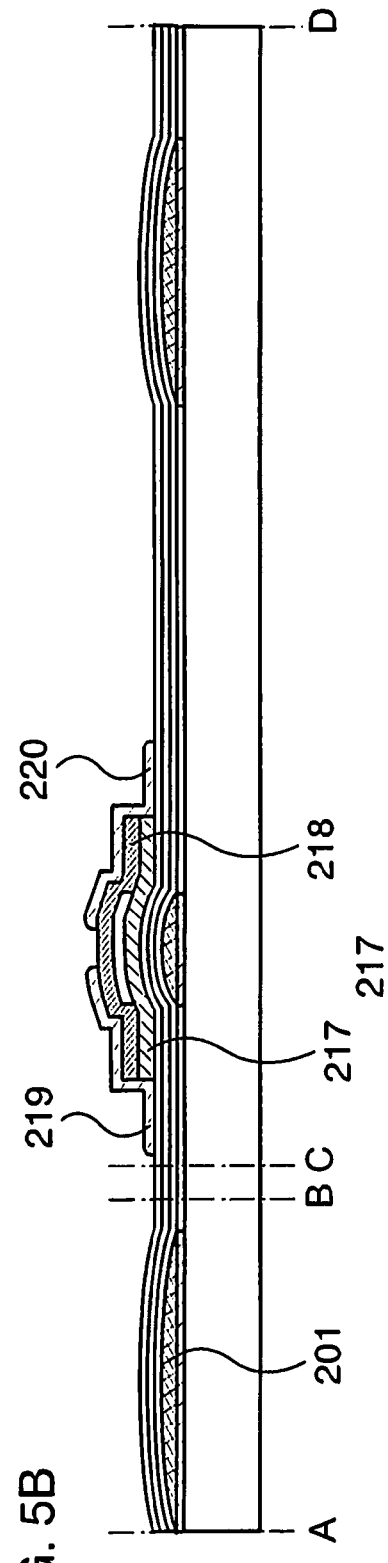
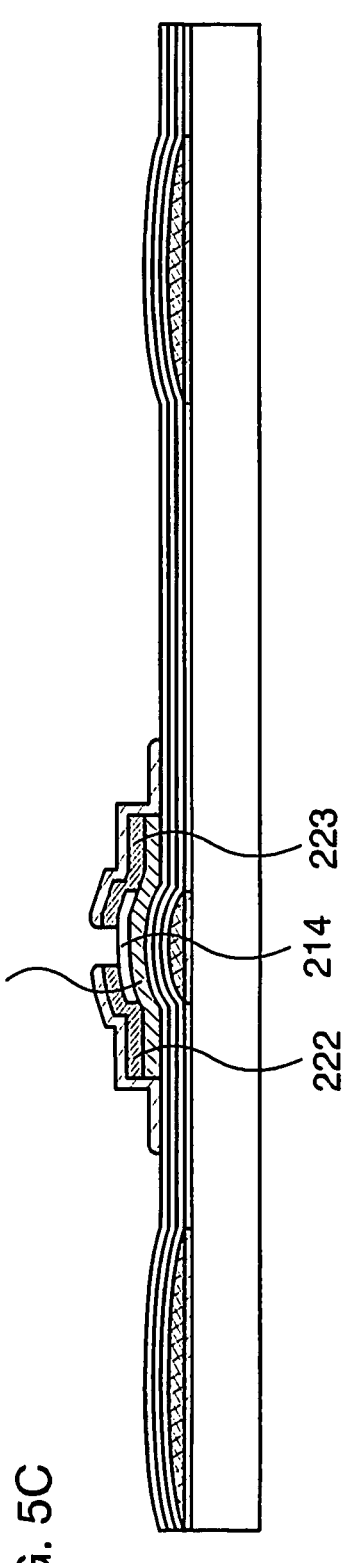
FIG. 5A
FIG. 5B
FIG. 5C

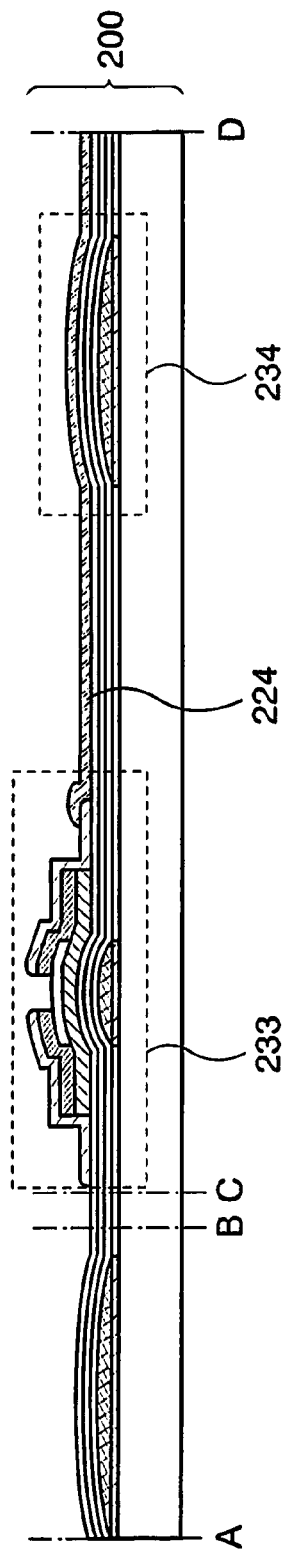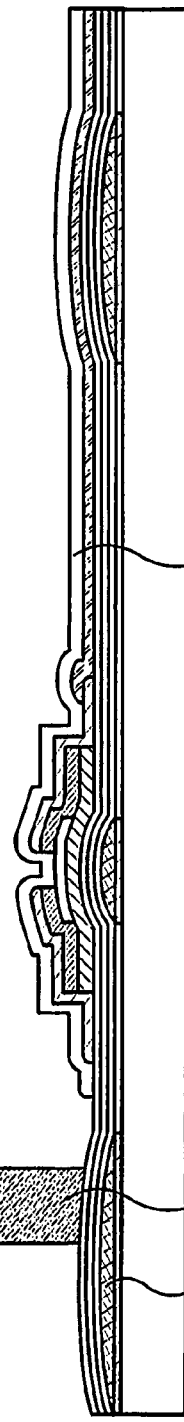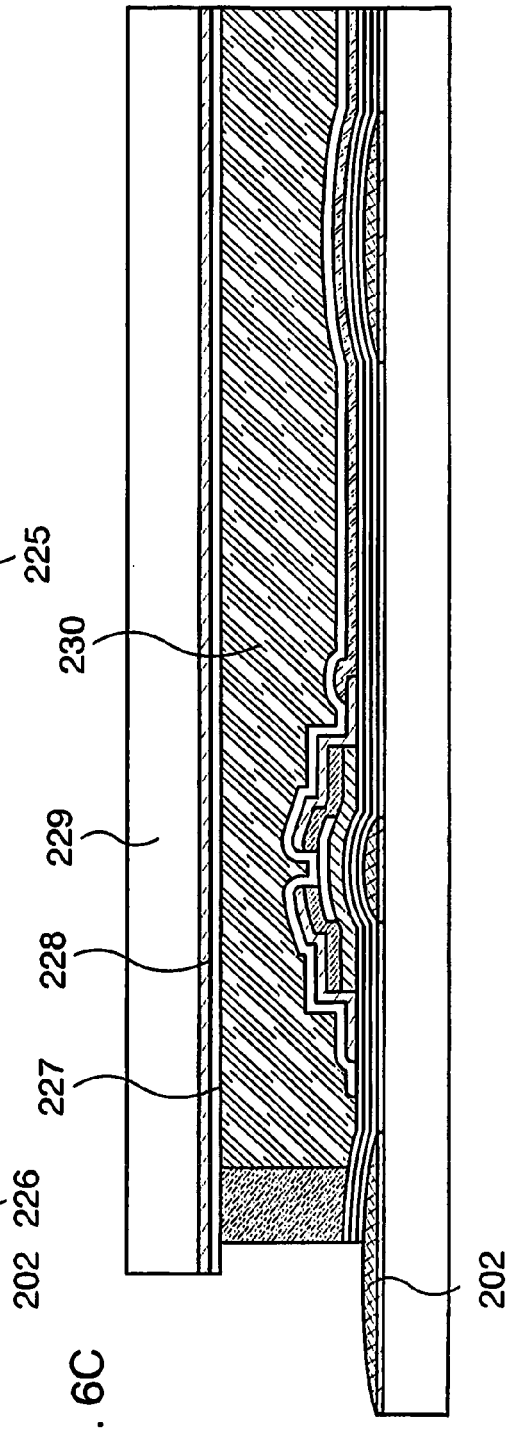

LIQUID CRYSTAL DISPLAY DEVICE AND METHOD FOR MANUFACTURING THE SAME, AND LIQUID CRYSTAL TELEVISION RECEIVER

TECHNICAL FIELD

The present invention relates to a display device to which an active element such as a transistor formed over a glass substrate is applied and to a method for manufacturing the same.

BACKGROUND ART

Conventionally, a display panel of a so-called active matrix driving method constituted by a thin film transistor (hereinafter also referred to as a "TFT") over a glass substrate is known. As well as a manufacturing technique of a semiconductor integrated circuit, this display panel needs a step of patterning a thin film such as a conductor, a semiconductor, or an insulator by a light-exposure step using a photomask.

A size of a mother glass substrate used for manufacturing a display panel is enlarged from 300 mm×400 mm of the first generation in the early 1990s to 680 mm×880 mm or 730 mm×920 mm of the fourth generation in 2000. Furthermore, the manufacturing technique made such a development that a number of display panels can be obtained from one substrate.

When a size of a glass substrate or a display panel is small, patterning can be carried out comparatively easily by using a photolithography machine. However, as a substrate size is enlarged, an entire surface of a display panel cannot be simultaneously treated by carrying out light-exposure treatment once. Consequently, it is necessary to divide a region where a photoresist is applied into a plurality of block regions and to carry out light-exposure treatment on every predetermined block regions. As for light-exposure treatment, a method for exposing an entire surface of a substrate to light by sequentially repeating the treatment has been developed (for example, see Reference 1: Japanese Patent Application Laid-Open No. Hei 11-326951 and 2: U.S. Pat. No. 6,291,136 B1).

DISCLOSURE OF INVENTION

Problem to be Solved by the Invention

However, a glass substrate is further enlarged to a size of 1000 mm×1200 mm or 1100 mm×1300 mm in the fifth generation, and a size of 1500 mm×1800 mm or more is assumed in the next generation. A large sized glass substrate is effective in enlarging a size of display panel and increasing the number of a display panel to be obtained; however, it is difficult to manufacture a display panel at good productivity with low cost by a conventional patterning method. In other words, when a plurality of times of light-exposure is carried out by consecutive light exposure, a processing time is increased and tremendous investment is required for developing a photolithography machine that can treat a large-sized glass substrate.

Moreover, in a method for forming various types of thin films over an entire surface of a substrate and for removing the thin films to leave a slight region by etching, there is a problem that a material cost is wasted and disposal of a large quantity of effluent is forced.

In view of the above situation, the object of the present invention is to provide a liquid crystal display device capable of improving utilizing efficiency of a material and of simplifying a manufacturing step and a manufacturing technique thereof.

Means to Solve the Problem

According to one aspect of the present invention, at least one or more of a conductive layer which forms a wiring or an electrode and a pattern such as a mask for forming a predetermined pattern which is necessary for manufacturing a display panel is formed by a method capable of selectively forming a pattern to manufacture a liquid crystal display device. A droplet discharge method (also referred to as a inkjet method depending on a system to be applied) capable of forming a predetermined pattern by selectively discharging a droplet of a composition in accordance with a particular object is used as a method capable of selectively forming a pattern.

According to another aspect of the invention, a method for manufacturing a liquid crystal display device comprises the steps of: forming a gate electrode over a substrate having an insulating surface with a droplet discharge method; laminating a gate insulating layer, a semiconductor layer, and an insulating layer over the gate electrode; forming a first mask in a position overlapping with the gate electrode with a droplet discharge method; forming a channel protective layer by etching the insulating layer by using the first mask; forming a semiconductor layer containing one conductivity type impurity; forming a second mask in a region including the gate electrode with a droplet discharge method; etching the semiconductor layer containing one conductivity type impurity and the semiconductor layer; forming source and drain wirings with a droplet discharge method; and etching the semiconductor layer containing one conductivity type impurity on the channel protective layer by using the source and drain wirings as masks.

According to another aspect of the invention, a method for manufacturing a liquid crystal display device comprises the steps of: forming a gate electrode and a connection wiring over a substrate having an insulating surface with a droplet discharge method; laminating a gate insulating layer, a semiconductor layer, and an insulating layer over the gate electrode; forming a first mask in a position overlapping with the gate electrode with a droplet discharge method; forming a channel protective layer by etching the insulating layer by using the first mask; forming a semiconductor layer containing one conductivity type impurity; forming a second mask in a region including the gate electrode with a droplet discharge method; etching the semiconductor layer containing one conductivity type impurity and the semiconductor layer; partially exposing the connection wiring by selectively etching the gate insulating layer; forming source and drain wirings and connecting at least one of the wirings to the connection wiring; and etching the semiconductor layer containing one conductivity type impurity on the channel protective layer by using the source and drain wirings as masks.

In the above-mentioned step of laminating a gate insulating layer, a semiconductor layer, and an insulating layer over the gate electrode, it is preferable to successively form each layer of the gate insulating layer, the semiconductor layer, and the insulating layer without exposing to the atmosphere by a vapor phase growth method using plasma (refer to as plasma CVD) or a sputtering method.

By sequentially laminating a first silicon nitride film, a silicon oxide film, and a second silicon nitride film to form a gate insulating layer, the gate electrode can be prevented from being oxidized and a satisfactory interface between the semiconductor layer formed over the upper layer side of the gate insulating layer can be formed.

As mentioned above, according to the other aspect of the invention, the gate electrode, the wiring, and the mask used during patterning are formed by a droplet discharge method. However, at least one or more patterns necessary for manufacturing a liquid crystal display device are formed by a method capable of selectively forming a pattern to manufacture a liquid crystal display device, thereby achieving the object. In the invention, a screen printing method capable of selectively forming a pattern or other printing methods can be also applied instead of a droplet discharge method.

According to the other aspect of the invention, a liquid crystal display device, over one of substrates sandwiching a liquid crystal, comprises: a thin film transistor including a lamination of a gate electrode formed by making fusion and/or welding of (by fusing) conductive nanoparticles, a silicon nitride layer or a silicon nitride oxide layer formed to be in contact with the gate electrode, a gate insulating layer at least containing a silicon oxide layer, and a semiconductor layer from a substrate side; and a pixel electrode connecting to the thin film transistor.

According to the other aspect of the invention, a liquid crystal display device, over one of substrates sandwiching a liquid crystal, comprises: a thin film transistor including a lamination of a gate electrode formed by making fusion and/or welding of (by fusing) conductive nanoparticles, a silicon nitride layer or a silicon nitride oxide layer formed to be in contact with the gate electrode, a gate insulating layer at least containing a silicon oxide layer, a semiconductor layer, and a silicon nitride layer or a silicon nitride oxide layer formed to be in contact with a wiring connected to a source and a drain and formed by making fusion and/or welding of (by fusing) conductive nanoparticles from a substrate side; and a pixel electrode connecting to the thin film transistor.

According to the other aspect of the invention, a liquid crystal display device, over one of substrates sandwiching a liquid crystal, comprises: a first thin film transistor having, from a substrate side, a lamination of a gate electrode formed by making fusion and/or welding of (by fusing) conductive nanoparticles, a silicon nitride layer or a silicon nitride oxide layer formed by being contact with the gate electrode, a gate insulating layer at least containing a silicon oxide layer and a semiconductor layer; a pixel electrode connecting to the first thin film transistor; a driver circuit including a second thin film transistor formed by having the same layer structure as the first thin film transistor; and a wiring extending from the driver circuit and connecting to the gate electrode of the first thin film transistor.

According to the other aspect of the invention, a liquid crystal display device, over one of substrates sandwiching a liquid crystal, comprises: a driver circuit including a first thin film transistor having a lamination of a gate electrode formed by making fusion and/or welding of (by fusing) conductive nanoparticles, a silicon nitride layer or a silicon nitride oxide layer formed to be in contact with the gate electrode, a gate insulating layer at least containing a silicon nitride layer or silicon oxynitride layer and a silicon oxide layer, a semiconductor layer, and a silicon nitride layer or a silicon nitride oxide layer formed to be in contact with wirings connected to a source and a drain and formed by making fusion and/or welding of (by fusing) conductive nanoparticles from a substrate side; a pixel electrode connecting to the first thin film transistor; a driver circuit including a second thin film transistor formed by having the same layer structure as the first thin film transistor; and a wiring extending from the driver circuit and connecting to the gate electrode of the first thin film transistor.

According to the invention, the gate electrode or the wiring is formed with a droplet discharge method, and a conductive substance can be formed from silver or an alloy containing silver. In addition, a silicon nitride film or a silicon nitride oxide film is provided over an upper layer of the gate electrode or the wiring to be in contact; therefore, the gate electrode can be prevented from being deteriorated due to oxidization.

In the invention, it is also possible that the semiconductor layer, which is a main portion of a thin film transistor, contains hydrogen and halogen, and is formed from a semiamorphous semiconductor containing a crystal structure. Accordingly, a driver circuit only including an n-channel type thin film transistor can be provided. In other words, the semiconductor layer contains hydrogen and halogen and is a semiconductor having a crystal structure, thereby realizing the driver circuit over one substrate by the thin film transistor which is capable of being operated with electric field effect mobility of from 1 cm$^2$/V·sec to 15 cm$^2$/V·sec cm$^2$.

ADVANTAGEOUS EFFECT

According to the present invention, patterning of a wiring or a mask can be carried out directly by a droplet discharge method; therefore, a thin film transistor in which utilization efficiency of a material is improved and a manufacturing step is simplified, and a liquid crystal display device using the thin film transistor can be obtained.

BRIEF DESCRIPTION OF THE DRAWINGS

FIGS. 4A to 4C each show cross-sectional views illustrating a method for manufacturing a liquid crystal display panel according to the invention;

FIGS. 5A to 5C each show cross-sectional views illustrating a method for manufacturing a liquid crystal display panel according to the invention;

FIGS. 6A to 6C each show cross-sectional views illustrating a method for manufacturing a liquid crystal display panel according to the invention;

BEST MODE FOR CARRYING OUT THE INVENTION

Figure 1:
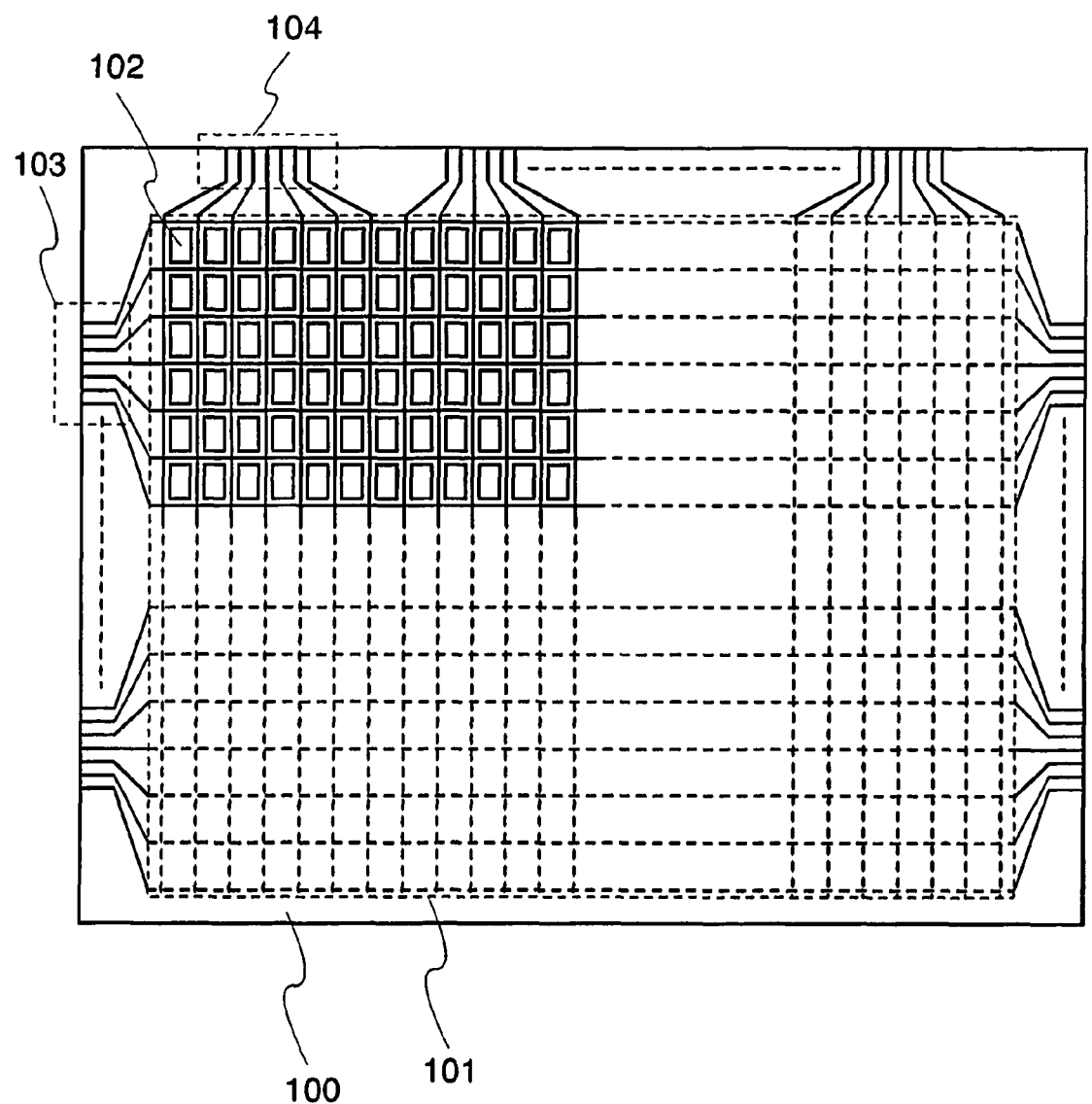
FIG. 1 shows a top view illustrating a structure of a liquid crystal display panel according to the invention.

Embodiment mode of the present invention will be explained in detail with reference to the drawings. Note that the same reference numerals denote the same parts among each drawing, and the explanation will not be repeated in the following explanations. In addition, it is to be understood that various changes and modifications will be apparent to those skilled in the art, unless such changes and modifications depart from content and the scope of the invention. Therefore, the invention is not interpreted with limiting to the description in this embodiment mode.

FIG. 1 shows a top view of a structure of a liquid crystal display panel according to the present invention. A pixel portion 101 in which pixels 102 are arranged in a matrix, a scanning line input terminal 103, and a signal line input terminal 104 are formed over a substrate 100 having an insulating surface. The number of pixels may be provided according to various standards. The number of pixels of XGA may be 1024×768×3 (RGB), that of UXGA may be 1600×1200×3 (RGB), and that of a full-speck high vision to correspond thereto may be 1920×1080×3 (RGB).

The pixels 102 are arranged in a matrix by intersecting a scanning line extended from the scanning line input terminal 103 with a signal line extended from the signal line input terminal 104. Each pixel 102 is provided with a switching element and a pixel electrode connected thereto. A typical example of the switching element is a TFT. A gate electrode side of a TFT is connected to the scanning line, and a source or drain side thereof is connected to the signal line; therefore, each pixel can be controlled independently by a signal inputted from outside.

A TFT includes a semiconductor layer, a gate insulating layer, and a gate electrode as main components. A wiring connected to one of a source region and a drain region which are formed in the semiconductor layer is concomitant thereof. A top gate type in which a semiconductor layer, a gate insulating layer, and a gate electrode are sequentially arranged from the substrate side, a bottom gate type in which a gate electrode, a gate insulating layer, and a semiconductor layer are sequentially arranged from the substrate side, or the like is known as a structure of a TFT. However, any one of structures may be applied to the invention.

An amorphous semiconductor (hereinafter also referred to as an "AS") manufactured by a vapor phase growth method using a semiconductor material gas typified by silane or germane or a sputtering method; a polycrystalline semiconductor that is formed by crystallizing the amorphous semiconductor by utilizing light energy or thermal energy; a semi-amorphous (also referred to as microcrystallite or microcrystalline, and hereinafter also referred to as an "SAS") semiconductor; or the like can be used for a material which forms a semiconductor layer.

An SAS is a semiconductor with an intermediate structure between an amorphous structure and a crystal structure (including a single crystal and a polycrystal). This is a semiconductor having a third condition that is stable in regard to a free energy, and a crystalline region having a short distance order and lattice distortion is included therein. A crystalline region of from 0.5 nm to 20 nm can be observed at least in a part of region in the film. When silicon is contained as the main component, Raman spectrum is shifted to a lower frequency side less than 520 $cm^{-1}$. Diffraction peak of (111) or (220) to be caused from a crystal lattice of silicon is observed in X-ray diffraction. At least 1 atomic % or more of hydrogen or halogen is contained to terminate of a dangling bond. An SAS is formed by carrying out grow discharge decomposition (plasma CVD) on a silicide gas. In addition to $SiH_4$, $Si_2H_6$, $SiH_2Cl_2$, $SiHCl_3$, $SiCl_4$, $SiF_4$, or the like can be used for the silicide gas. In addition, $GeF_4$ may be mixed. This silicide gas may be diluted with $H_2$ or $H_2$ and one or more of the rare gas element of He, Ar, Kr, and Ne. A dilution ratio ranges from 2 times to 1000 times. A pressure ranges approximately from 0.1 Pa to 133 Pa, and a power frequency ranges from 1 MHz to 120 MHz, preferably from 13 MHz to 60 MHz. A substrate heating temperature may be 300° C. or less. It is desirable that an atmospheric constituent impurity such as oxygen, nitrogen, or carbon is $1×10^{20}$ $cm^{-1}$ or less as an impurity element in the film, specifically an oxygen concentration is $5×10^{19}/cm^3$ or less, preferably $1×10^{19}/cm^3$ or less.

Figure 2:
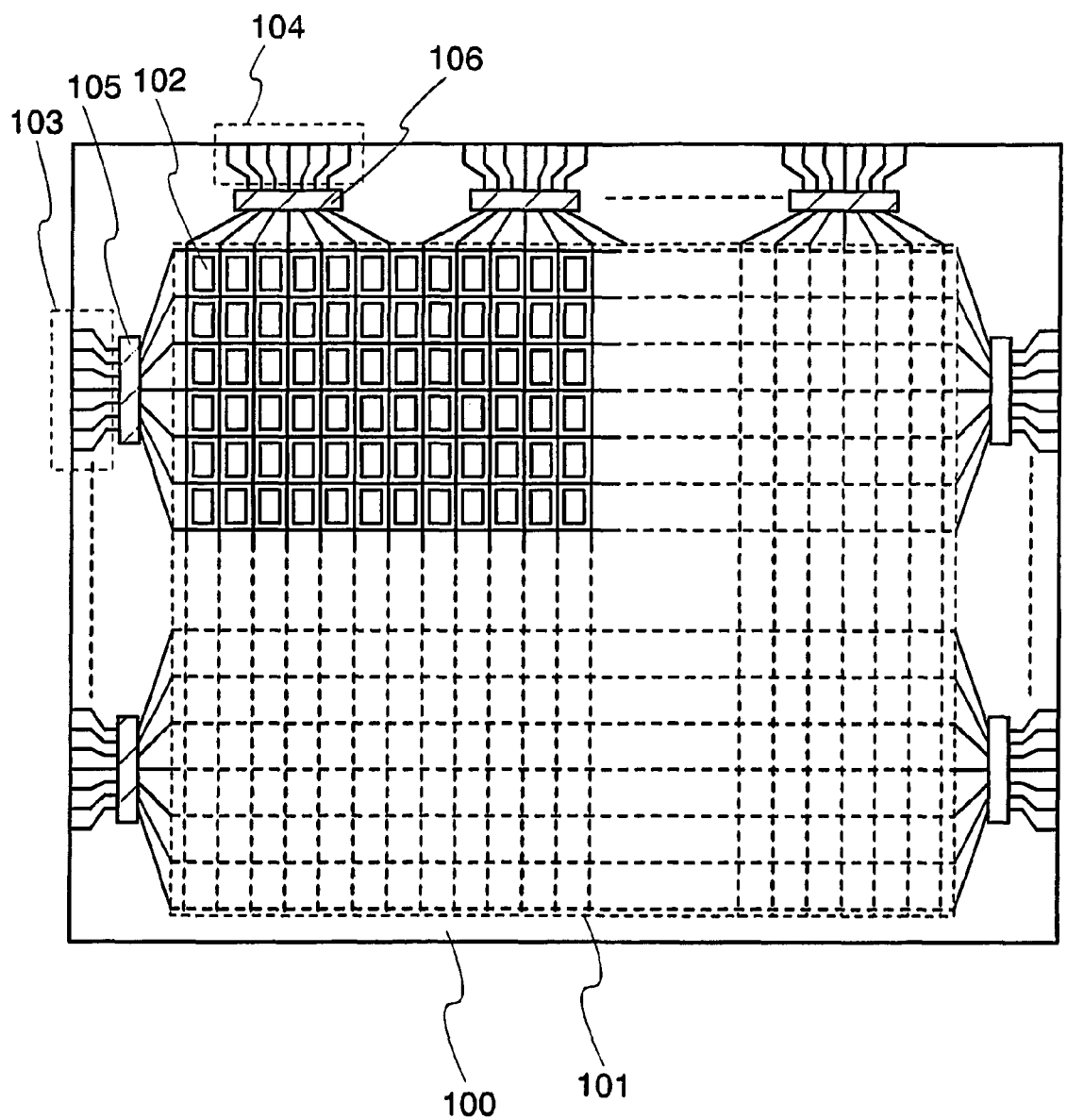
FIG. 2 shows a top view illustrating a structure of a liquid crystal display panel according to the invention.

FIG. 1 shows a structure of a liquid crystal display panel that controls a signal inputting into a scanning line and a signal line by an external driver circuit. Furthermore, a driver IC may be mounted on a substrate 100 by a COG (Chip on Glass) as shown in FIG. 2. FIG. 2 shows a mode in which a scanning line driver IC 105 and a signal line driver IC 106 are mounted on the substrate 100. The scanning line driver IC 105 is provided between a scanning line input terminal 103 and a pixel portion 101.

Figure 3:
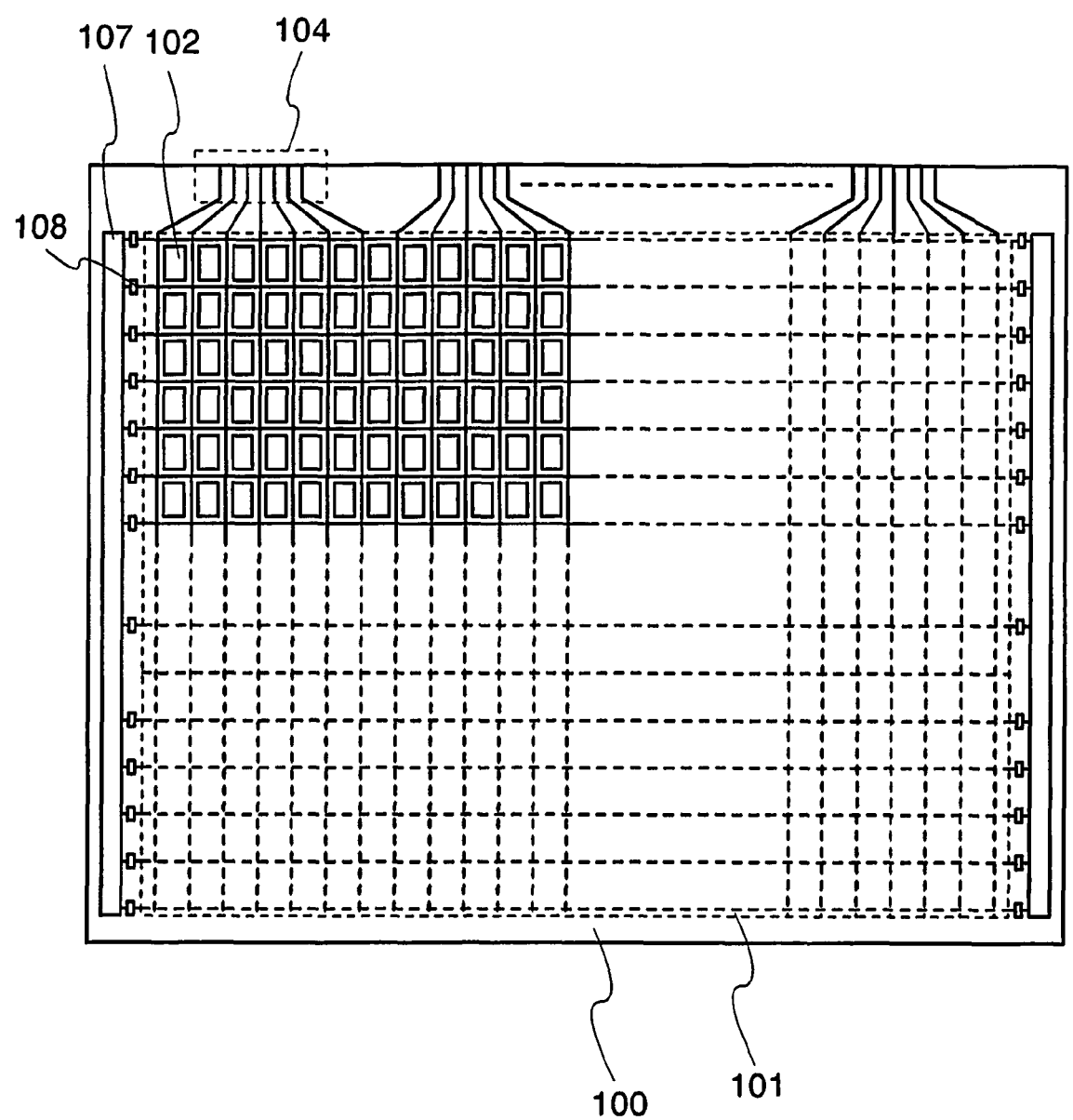
FIG. 3 shows a top view illustrating a structure of a liquid crystal display panel according to the invention.

In addition, a TFT provided for a pixel can be formed from an SAS. Since a TFT using an SAS has an electric field effect mobility of from 1 cm$^2$/V·sec to 15 cm$^2$/V sec, a driver circuit can be formed. FIG. 3 shows an example of forming a scanning line driver circuit 107. Furthermore, a protective circuit 108 can be also provided between the scanning line driver circuit 107 and a pixel portion 101. The number of input terminals can be reduced by forming the scanning line driver circuit 107 with a TFT over the substrate 100.

Figure 28:
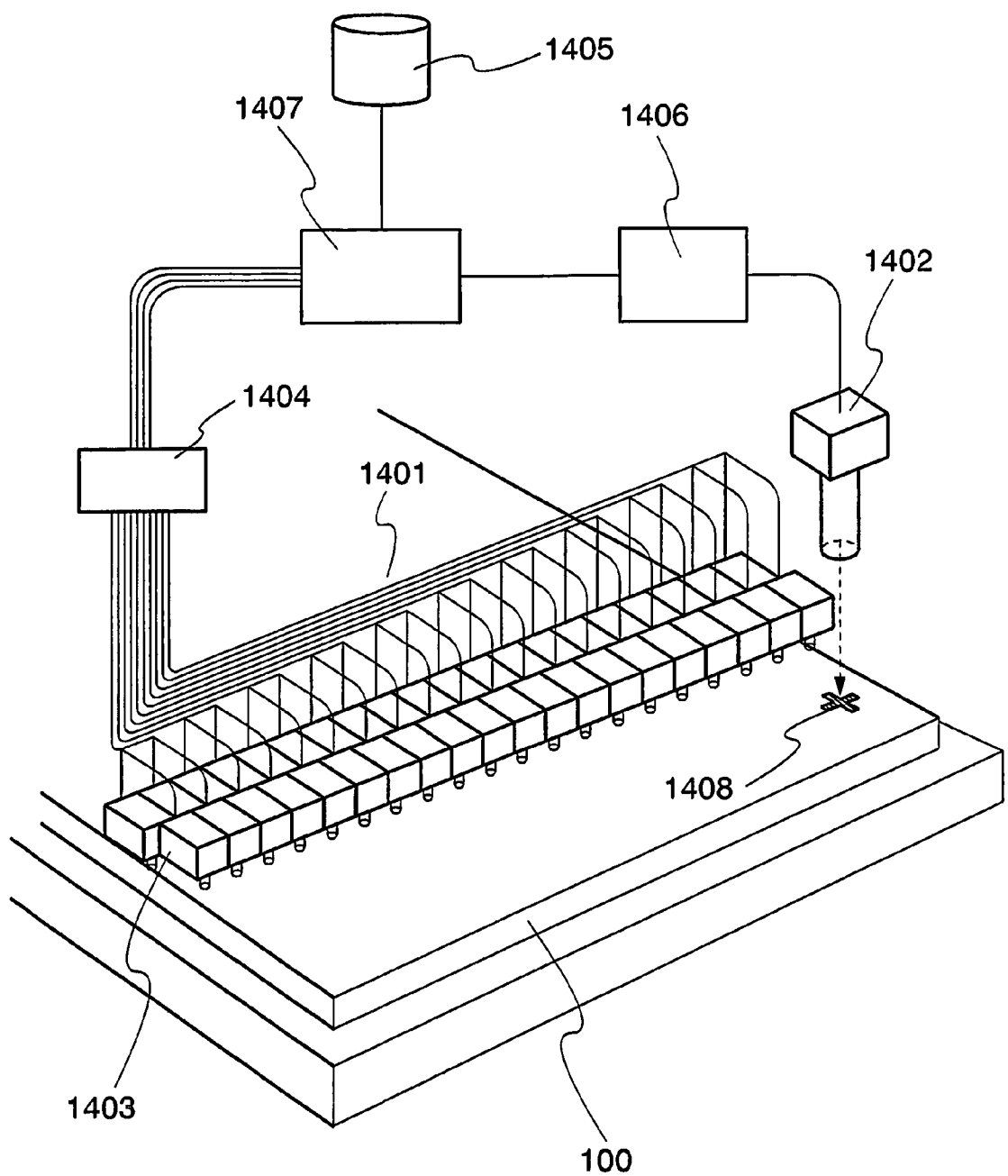
FIG. 28 shows a view illustrating a structure of a droplet discharge device applicable to the invention.

FIG. 28 shows one mode of a droplet discharge device used for forming patterns. Each head 1403 of a droplet discharge means 1401 is individually connected to a control means 1404. The control means 1404 controls droplet discharge from the head 1403. The timing of discharging droplet is controlled based on the program inputted into a computer 1407. A position of discharging a droplet may be decided based on a marker 1408 formed over a substrate 100 for example. In addition, a reference point may be fixed with an edge of the substrate 100 as a reference. A reference point is detected by an imaging means 1402 such as a CCD, and the computer 1407 recognizes a digital signal to which the reference point is converted by an image processing means 1406 to generate a control signal. Of course, information of a pattern to be formed over the substrate 100 is placed in a recording medium 1405. Based on this information, the control signal can be transmitted to the control means 1404 and each head 1403 of the droplet discharge means 1401 can be controlled individually.

Next, a step of manufacturing a liquid crystal display panel using such a droplet discharge device is explained hereinafter.

Embodiment Mode 1

A method for manufacturing a channel protective type thin film transistor and a liquid crystal display device with the use thereof are explained in Embodiment mode 1.

Figure 13:
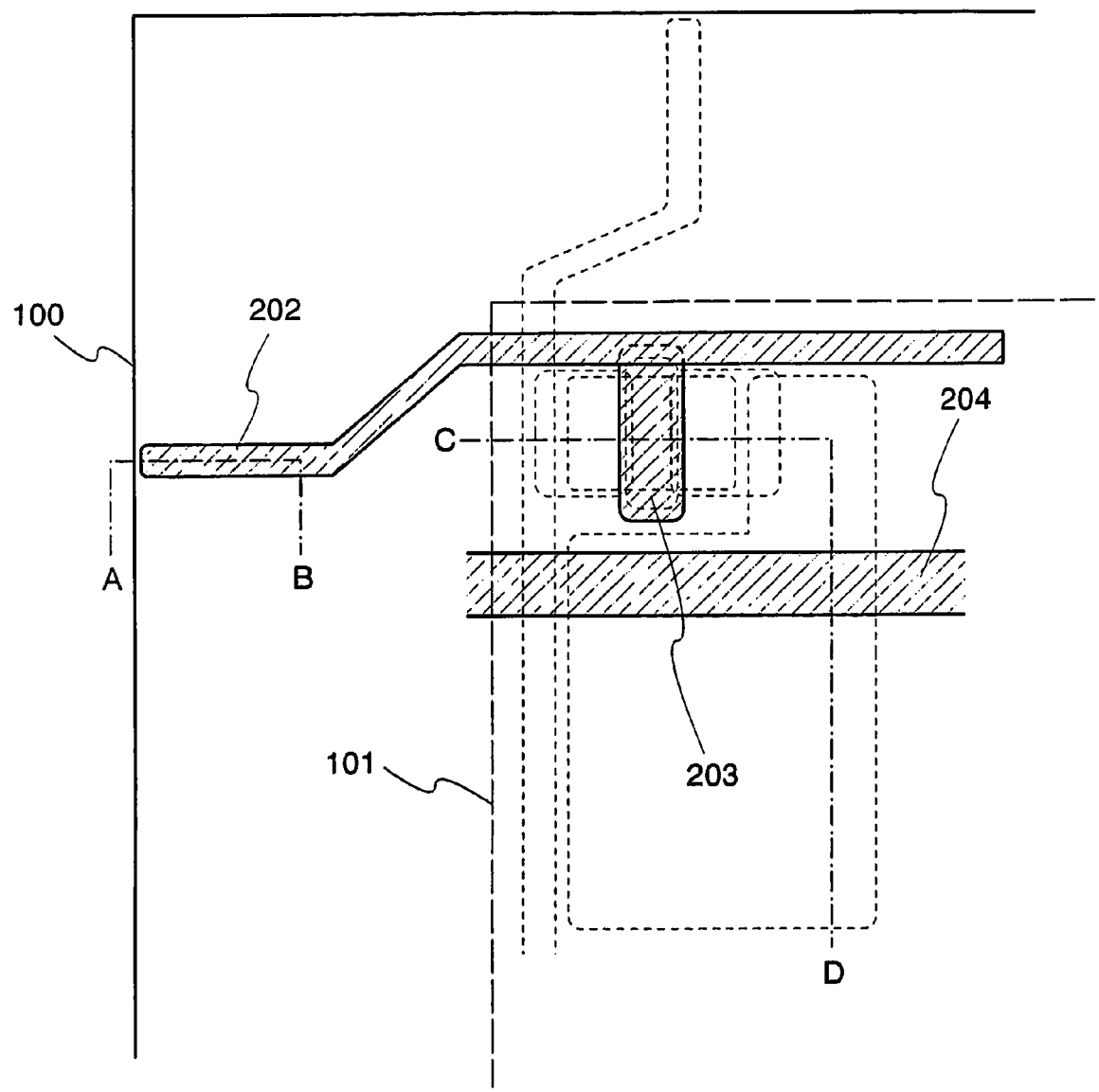
FIG. 13 shows a top view illustrating a method for manufacturing a liquid crystal display panel according to the invention.

FIG. 4A shows a step of forming a gate electrode and a gate wiring connected to the gate electrode with a droplet discharge method over a substrate 100. Note that FIG. 4A shows a longitudinal sectional structure, and FIG. 13 shows a planar structure corresponding to A-B and C-D thereof.

In addition to a non-alkaline glass substrate such as barium borosilicate glass, alumino borosilicate glass, and aluminosilicate glass manufactured with a fusion method or a floating method, and a ceramic substrate, a plastic substrate having the heat resistance that can withstand processing temperature or the like can be used for the substrate 100. In addition, a semiconductor substrate such as single crystal silicon, a substrate in which a surface of a metal substrate such as stainless is provided with an insulating layer may be applied too.

A conductive layer 201 containing a metal selected from the group consisting of Ti (titanium), W (tungsten), Cr (chromium), Al (aluminum), Ta (tantalum), Ni (nickel), Zr (zirconium), Hf (hafnium), V (vanadium), Ir (iridium), Nb (niobium), Pd (palladium), Pt (platinum), Mo (molybdenum), Co (cobalt), and Rh (rhodium) is preferably formed over the substrate 100 by a method such as a sputtering method or a vapor deposition method. The conductive layer 201 may be formed to have a film thickness of from 0.01 nm to 10 nm; however, a film structure is not necessarily needed since it may be formed extremely thin. Note that this conductive layer 201 is provided to form the gate electrode with good adhesiveness. When adequate adhesiveness is obtained, the gate electrode may be directly formed on the substrate 100 without forming the conductive layer 201.

A wiring 202, a gate electrode 203, and a capacitor wiring 204 are formed over the conductive layer 201 by discharging a composition containing a conductive substance with a droplet discharge method. The composition containing a metal such as silver, gold, copper, tungsten, or aluminum as the main component can be used as the conductive substance which forms these layers. In addition, indium tin oxide (ITO) and indium tin oxide containing silicon oxide (ITSO) which have a light transmitting property may be combined. Specifically, the gate wiring is preferable to be low resistance. Therefore, a material in which any one of gold, silver, or copper dissolved or dispersed in a solvent is preferably used, and more preferably silver or copper with low resistance is used in consideration of a specific resistance value. However, in the case of using silver or copper, a barrier film may be additionally provided to protect from an impurity. A solvent corresponds to an organic solvent such as esters like butyl acetate, alcohols like isopropyl alcohol, or acetone. Surface tension and viscosity are appropriately adjusted by adjusting concentration of solution and adding a surface activator or the like.

Since the gate electrode needs to be formed minutely, a nano paste containing particles of which average particle size is from 5 nm to 10 nm is preferably used. In addition, the gate electrode may be formed by discharging a composition containing particles covered the circumference of a conductive material with other conductive materials. For example, as for particles covered the circumference of copper with silver, a conductive particle provided with a buffer layer made from Ni or NiB (nickel boron) between copper and silver may be used. A solvent corresponds to an organic solvent such as esters like butyl acetate, alcohols like isopropyl alcohol, and acetone. Surface tension and viscosity are appropriately adjusted by adjusting concentration of solution and adding a surface activator or the like.

A diameter of a nozzle used in a droplet discharge method is set to be from 0.02 μm to 100 μm (preferably, 30 μm or less), and a discharging amount of a composition discharged from the nozzle is preferably set to be from 0.001 pl to 100 pl (preferably, 10 pl or less). There are two types of an on-demand type and a continuous type for a droplet discharge method, both of which may be used. Furthermore, there is a piezoelectric system using properties that a piezoelectric material is deformable by applying voltage and a heating system that boils a composition by a heater provided in a nozzle and discharges the composition for a nozzle to be used in a droplet discharge method, both of which may be used. A distance between a subject and a discharge opening of a nozzle is preferable to be made as close as possible to drop a droplet at a desired place, which is preferably set to be from 0.1 mm to 3 mm (preferably, 1 mm or less). While keeping the relative distance, one of the nozzle and the subject moves and a desired pattern is drawn. In addition, plasma treatment may be carried out on a surface of the subject before discharging a composition. This is to take advantage of a surface of the subject becoming hydrophilic and lyophobic when plasma treatment is carried out. For example, it becomes hydrophilic to deionized water and it becomes lyophobic to a paste dissolved with alcohol.

A step of discharging a composition may be carried out under low pressure so that a solvent of the composition can be volatilized while the composition is discharged and hit on a subject and later steps of drying and baking can be skipped or shortened. In a baking step of a composition containing a conductive material, resistivity of a conductive film constructing the gate electrode can be decreased and the conductive film can be made thin and smoothed by actively using a gas mixed with oxygen of which division ratio is from 10% to 30%.

After discharging a composition, either or both steps of drying and baking is carried out by irradiation of laser light, rapid thermal annealing, heating furnace, or the like under the atmospheric pressure or the reduced pressure. Both the steps of drying and baking are steps of heat treatment. For example, drying is carried out at 100° C. for 3 minutes and baking is carried out at temperatures from 200° C. to 350° C. for from 15 minutes to 120 minutes. In order to carry out the steps of drying and baking well, a substrate may be heated, of which temperatures are set to be from 100° C. to 800° C. (preferably, temperatures from 200° C. to 350° C.), though depending on a material of a substrate or the like. Through this step, a solvent in a composition is volatilized or dispersant is removed chemically, and a peripheral resin cures and shrinks, thereby accelerating fusion and welding. It is carried out under the oxygen atmosphere, the nitrogen atmosphere, or the atmospheric air. However, this step is preferable to be carried out under an oxygen atmosphere in which a solvent decomposing or dispersing a metal element is easily removed.

A continuous-wave or a pulsed gas laser or a solid state laser may be used for irradiation of laser light. There is an excimer laser, an Ar laser, or the like as the gas laser, and there is a laser using a crystal such as YAG or $YVO_4$ doped with Cr, Nd, or the like as the solid state laser. In the case of rapid thermal annealing, temperature is rapidly raised by using a halogen lamp or the like under the atmosphere of inert gas to carry out heat treatment that can be finished within a short time of from some microseconds to some minutes. By carrying out heat treatment in a short time, only the most upper-surface of a thin film can be substantially heated; therefore, there is advantageous that the base side is not affected.

A nano paste used for forming the conductive layer 201 is a matter dispersed or dissolved a conductive particle of which particle size is from 5 nm to 10 nm in an organic solvent, and also contains a dispersant or a thermosetting resin referred to as a binder. The binder has a function of preventing generation of crack or uneven baked state during baking. According to the drying and baking steps, evaporation of the organic solvent, degradation and removal of the dispersant, and hardening and shrinkage of the binder are carried out simultaneously; therefore, nanoparticles makes fusion and/or welding with each other to be hardened. In this case, the nanoparticles is grown from several tens nm to several hundreds nm. The grown particles close to each other makes fusion and/or welding to connect in chain with each other to form a chained metal body. On the other hand, almost all remaining organic component (approximately from 80% to 90%) is pushed to outside of the metal chain body. As a result, a conductive film containing the chained metal body and a film made from an organic component covering the outside of the conductive film are formed. Then, when a nano paste is baked under the atmosphere containing nitrogen and oxygen, oxygen contained in a gas is reacted with carbon, hydrogen, or the like contained in the film made from an organic component; therefore, the film made from an organic component can be removed.

In addition, when oxygen is not contained in the baking atmosphere, the film made from an organic component can be removed by additionally carrying out oxygen plasma treatment or the like. In this manner, the film made from an organic component is removed by baking a nano paste under the atmosphere containing nitrogen and oxygen or by carrying out oxygen plasma treatment after drying. Therefore, the conductive film containing the remaining metal chain body can be made smoothed, thin, or reduced in resistance. A solvent in a composition containing a conductive material volatilizes by discharging the composition under the low pressure; therefore, the time for subsequent heat treatment (drying or baking) can be shortened.

After forming the wiring 202, the gate electrode 203, and the capacitor wiring 204, it is desirable to carry out one of the following two steps as treatment of the conductive layer 201 of which surface is exposed.

A first method is a step of forming an insulating layer 205 by insulating the conductive layer 201 not overlapping with the wiring 202, the gate electrode 203, and the capacitor wiring 204 (see FIG. 4B). In other words, the conductive layer 201 not overlapping with the wiring 202, the gate electrode 203, and the capacitor wiring 204 are oxidized to be insulated. In the case of insulating the conductive layer 201 in this manner, the conductive layer 201 is preferably formed to have a film thickness of from 0.01 nm to 10 nm, so that it becomes an insulating layer by being oxidized. Note that either an exposing method to the oxygen atmosphere or a method for carrying out heat treatment may be used as an oxidizing method.

A second method is a step of etching and removing the conductive layer 201, using the wiring 202, the gate electrode 203, and the capacitor wiring 204 as the masks. In the case of using this step, there is no restriction on a film thickness of the conductive layer 201.

Next, a gate insulating layer 207 is formed in a single layer or a lamination by using a plasma CVD method or a sputtering method (see FIG. 4C). As a specifically preferable mode, a lamination body of three layers of a first insulating layer 208 made from silicon nitride, a second insulating layer 209 made from silicon oxide, and a third insulating layer 210 made from silicon nitride corresponds to the gate insulating layer. Note that a rare gas such as argon may be contained in a reactive gas and mixed into an insulating film to be formed in order to form a dense insulating film with little gate leak current at a low deposition temperature. Forming the first insulating layer 208 in contact with the wiring 202, the gate electrode 203, and the capacitor wiring 204 by silicon nitride or silicon oxynitride can prevent from deterioration by oxidation.

Next, a semiconductor layer 211 is formed. The semiconductor layer 211 is formed by an AS or an SAS with a vapor phase growth method using a semiconductor material gas typified by silane or germane or a sputtering method.

In the case of using a plasma CVD method, an AS is formed by $SiH_4$ which is a semiconductor material gas or a mixed gas of $SiH_4$ and $H_2$. When $SiH_4$ is diluted with $H_2$ by from 3 times to 1000 times to make a mixed gas or when $Si_2H_6$ is diluted with $GeF_4$ so that a gas flow rate of $Si_2H_6$ to $GeF_4$ is from 20:0.9 to 40:0.9, an SAS of which Si composition ratio is 80% or more can be obtained. Specifically, the latter case is preferable since the semiconductor layer 211 can have crystallinity from an interface with the third insulating layer 210.

An insulating layer 212 is formed over the semiconductor layer 211 by a plasma CVD method or a sputtering method. As shown in the following steps, this insulating layer 212 is left over the semiconductor layer 211 corresponding to the gate electrode 203 and serves as a channel protective layer. Therefore, it is preferable that the insulating layer 212 is formed of a dense film to obtain an advantageous effect of preventing the semiconductor layer 211 from being contaminated with impurities such as an organic substance, a metallic substance, or water vapor to ensure cleanliness of the interface. In a glow discharge decomposition method also, a silicon nitride film which is formed by diluting a silicide gas by from 100 times to 500 times with a noble gas such as argon is preferable since the dense film can be formed even at a deposition temperature of 100° C. or less. Furthermore, insulating films may be laminated to be formed, if necessary.

It is possible to continuously form the gate insulating layer 207 to the insulating layer 212 without exposing to the atmosphere. In other words, each interface between laminated layers can be formed without being contaminated by an atmospheric constituent and an airborne contaminated impurity element; therefore, variations in properties of a TFT can be reduced.

Next, a mask 213 is formed by selectively discharging a composition over the insulating layer 212 at a position that is corresponding to the gate electrode 203 (see FIG. 4C). A resin material such as an epoxy resin, an acrylic resin, a phenolic resin, a novolac resin, a melamine resin, or a urethane resin is used for the mask 213. In addition, the mask 213 is formed with a droplet discharge method by using an organic material such as benzocyclobutene, parylene, flare, or light-transmitting polyimide; a compound material made from polymerization such as siloxane-based polymer; a composition material containing water-soluble homopolymer and water-soluble copolymer; or the like. Alternatively, a commercial resist material containing a photosensitizer may be used. For example, a typical positive type resist comprising a novolac resin and naphthoquinonedi azide compound that is a photosensitizer, and a negative type resist comprising a base resin, diphenylsilane diol, and an acid generation agent may be used. In using any one of materials, surface tension and viscosity are appropriately adjusted by diluting a solution or adding a surface activator or the like.

The insulating layer 212 is etched by using the mask 213 in FIG. 4C, and an insulating layer 214 which functions as a channel protective layer is formed (see FIG. 5A). The mask 213 is removed, and an n-type semiconductor layer 215 is formed over the semiconductor layer 211 and the insulating layer 214. The n-type semiconductor layer 215 may be formed by using a silane gas and a phosphine gas and can be formed by an AS or an SAS.

Figure 14:
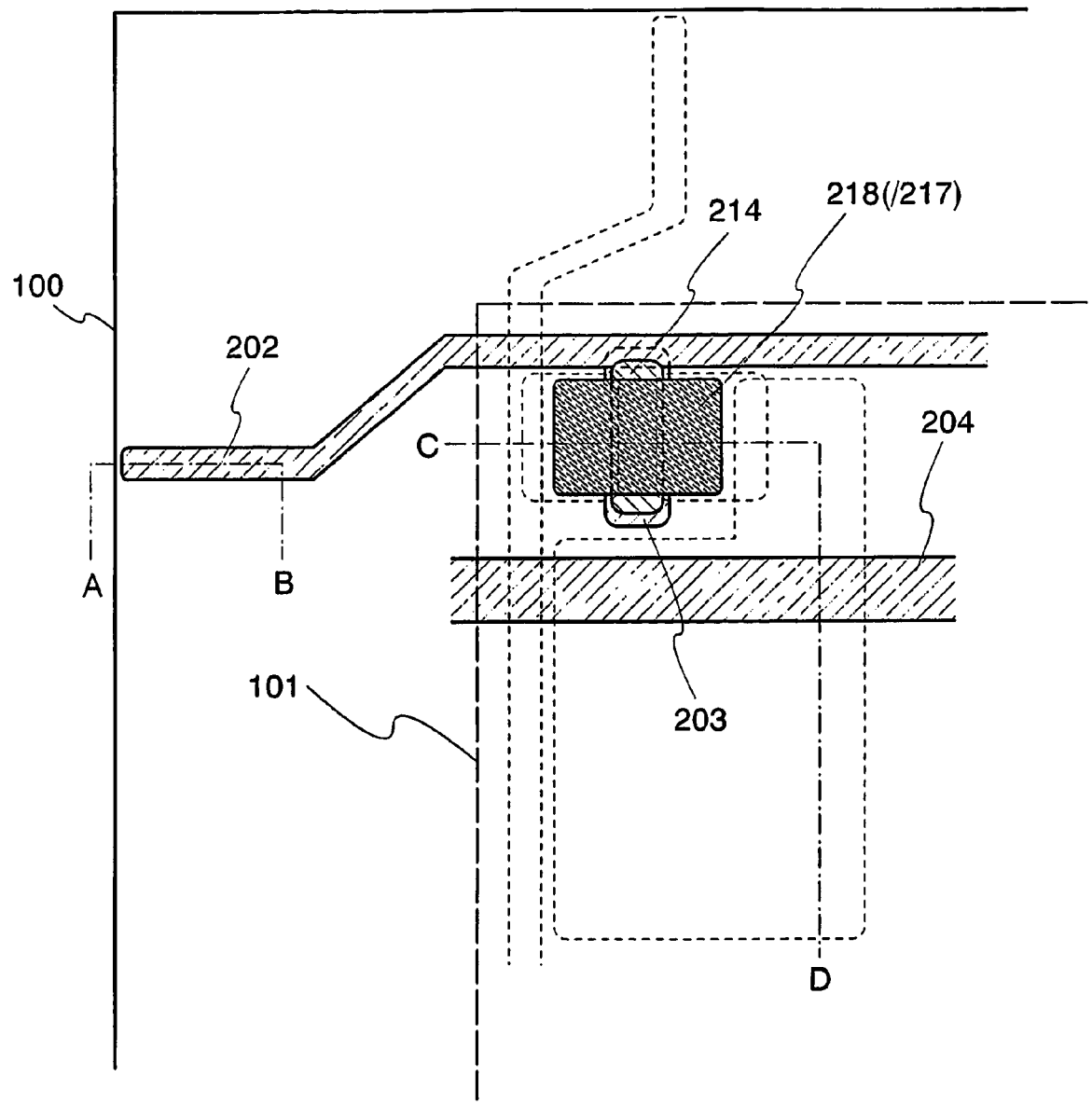
FIG. 14 shows a top view illustrating a method for manufacturing a liquid crystal display panel according to the invention.

Thereafter, a mask 216 is formed with a droplet discharge method on the n-type semiconductor layer 215. By using this mask 216, the n-type semiconductor layer 215 and the semiconductor layer 211 are etched. Thus, a semiconductor layer 217 and an n-type semiconductor layer 218 are formed (see FIG. 5B). Note that FIG. 5A shows a longitudinal sectional structure, and FIG. 14 shows a planar structure corresponding to A-B and C-D thereof.

Figure 15:
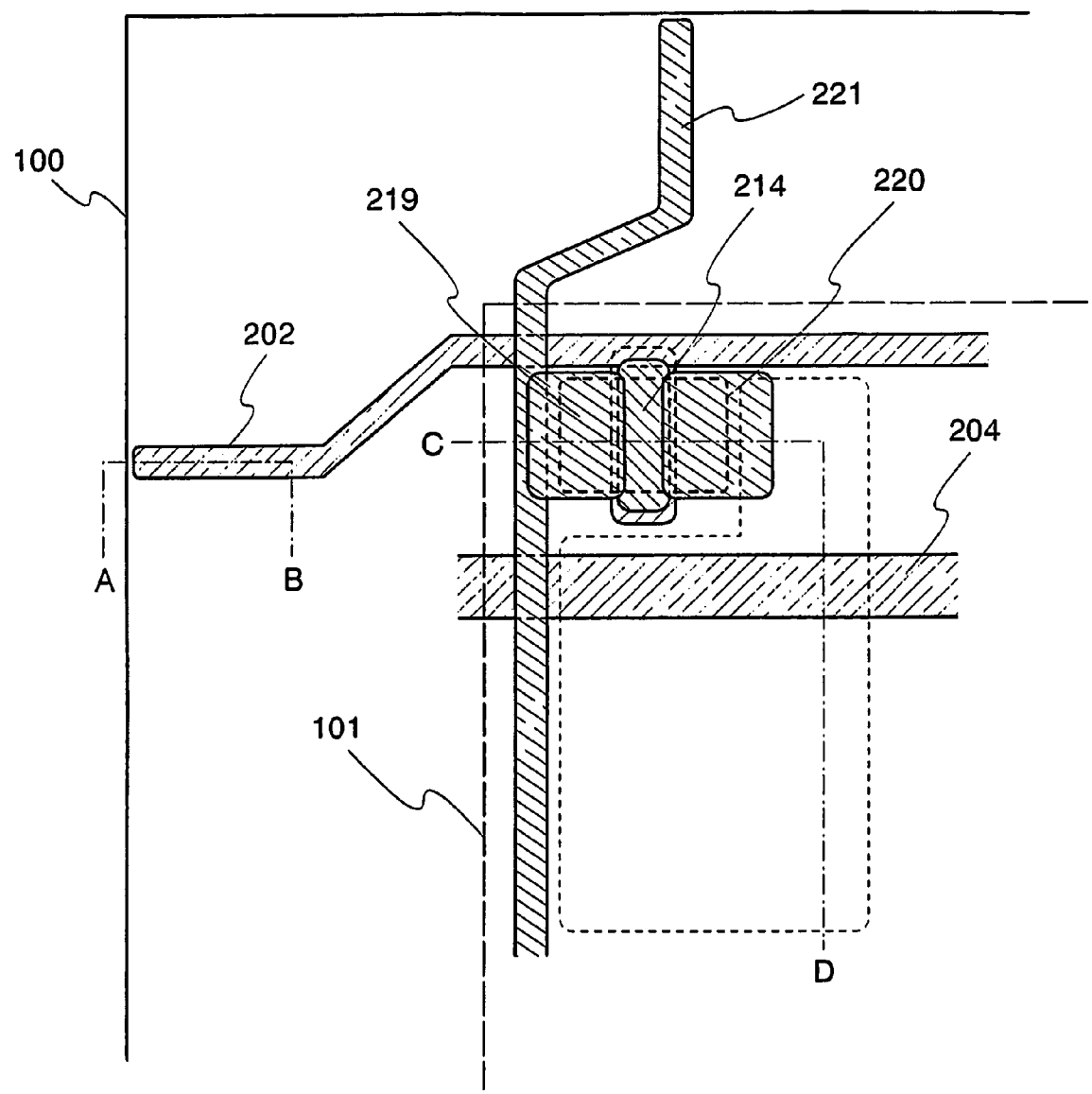
FIG. 15 shows a top view illustrating a method for manufacturing a liquid crystal display panel according to the invention.

Subsequently, after removing the mask 216, wirings 219 and 220 connected to a source and a drain are formed with a droplet discharge method by selectively discharging a composition containing a conductive substance (see FIG. 5B). FIG. 15 shows a planar structure corresponding to A-B and C-D shown in a longitudinal sectional structure of FIG. 5B. As shown in FIG. 15, a wiring 221 extending from one end of the substrate 100 is also formed. The wiring 221 is provided to electrically connect to the wiring 219 connected to the source and the drain. A composition containing particles of a metal such as silver, gold, copper, tungsten, or aluminum as the main component can be used as a conductive substance which forms this wiring. In addition, light-transmitting indium tin oxide (hereinafter also referred to as "ITO"), indium tin oxide containing silicon oxide (hereinafter also referred to as "ITSO"), organic indium, organotin, zinc oxide, titanium nitride, and the like may be combined.

Next, using the wirings 219 and 220 connected to at least one of the source and the drain as masks, n-type semiconductor layers 222 and 223 functioning as source and drain regions are formed by etching the n-type semiconductor layer 218 over the insulating layer 214 (see FIG. 5C).

Figure 16:
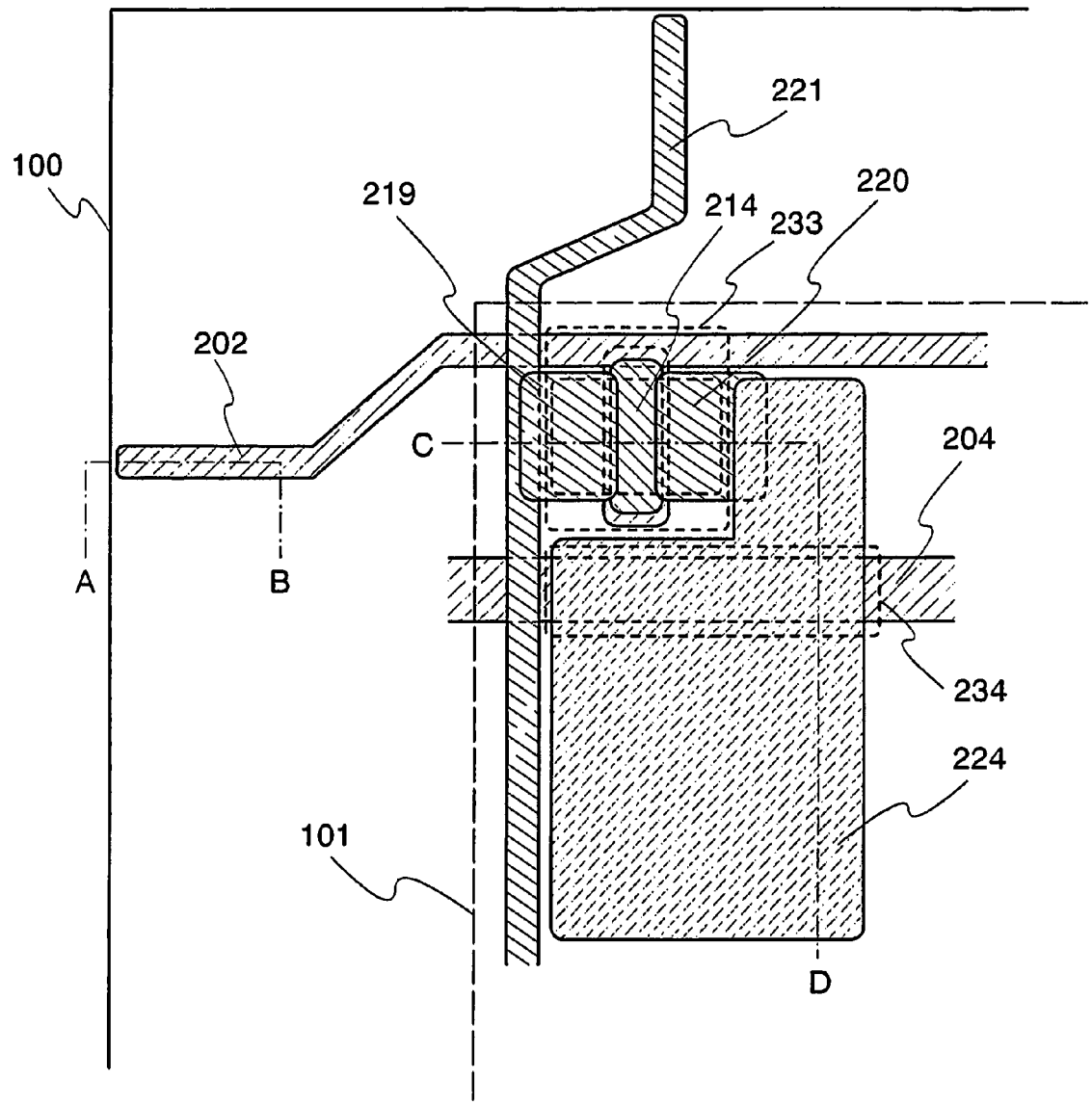
FIG. 16 shows a top view illustrating a method for manufacturing a liquid crystal display panel according to the invention.

Subsequently, a first electrode 224 corresponding to a pixel electrode is formed by selectively discharging a composition containing a conductive substance to be electrically connected to the wiring 220 connected to at least one of the source and the drain. In the case of manufacturing a transmission type liquid crystal display panel, the first electrode 224 may be formed a predetermined pattern by a composition containing indium tin oxide (ITO), indium tin oxide containing silicon oxide (ITSO), zinc oxide (ZnO), tin oxide ($SnO_x$), or the like, and baked to form a pixel electrode. In addition, in the case of manufacturing a reflection type liquid crystal display panel, a composition containing particles of a metal such as silver, gold, copper, tungsten, or aluminum as the main component can be used. As another method, a pixel electrode layer may be formed by transparent conductive film or a light reflective conductive film by a sputtering method, forming a mask pattern with a droplet discharge method, and combining an etching process (see FIG. 6A). Thus, switching TFT 233 and a capacitor element 234 is completed. Note that FIG. 6A shows a longitudinal sectional structure, and FIG. 16 shows a planar structure corresponding to A-B and C-D thereof.

Through the above-mentioned steps, a TFT substrate 200 for a liquid crystal display panel in which a bottom gate type (also referred to as a inversely staggered type) TFT and a pixel electrode are connected over the substrate 100 is completed.

Next, an insulating layer 225 referred to as an alignment film is formed to cover the first electrode 224 by a printing method or a spin coating method. Note that the insulating layer 225 can be selectively formed as shown in the drawing by using a screen printing method or an offset printing method. Rubbing treatment is carried out on the surface of the insulating layer 225 so that orientation of a liquid crystal can be controlled. Subsequently, a sealant 226 is formed by a droplet discharge method in the peripheral region where a pixel is formed (see FIG. 6B).

Thereafter, an opposite substrate 229 in which an insulating layer 227 functioning as an alignment film and a second electrode 228 functioning as an opposite electrode are provided is attached to the TFT substrate 200 by providing a spacer therebetween, and a liquid crystal display panel can be manufactured by providing the space with a liquid crystal layer 230 (see FIG. 6C). The sealant 226 may be mixed with a filler, and further, a color filter, a shielding film (a black matrix), or the like may be formed over the opposite substrate 229. Note that a dispenser type (a dropping type) or a dip type (a pumping type) that is a method of injecting a liquid crystal by using a capillary phenomenon after attaching the opposite substrate 229 can be used as a method for forming the liquid crystal layer 230.

A closed loop is formed with the sealant 226 in a liquid crystal drip injection method to which a dispenser type is applied, and a liquid crystal is dropped once or several times therein. Subsequently, the substrates are attached in vacuum, and then cured by UV irradiation to make a state filled with liquid crystals after carrying out ultraviolet curing.

Figure 7:
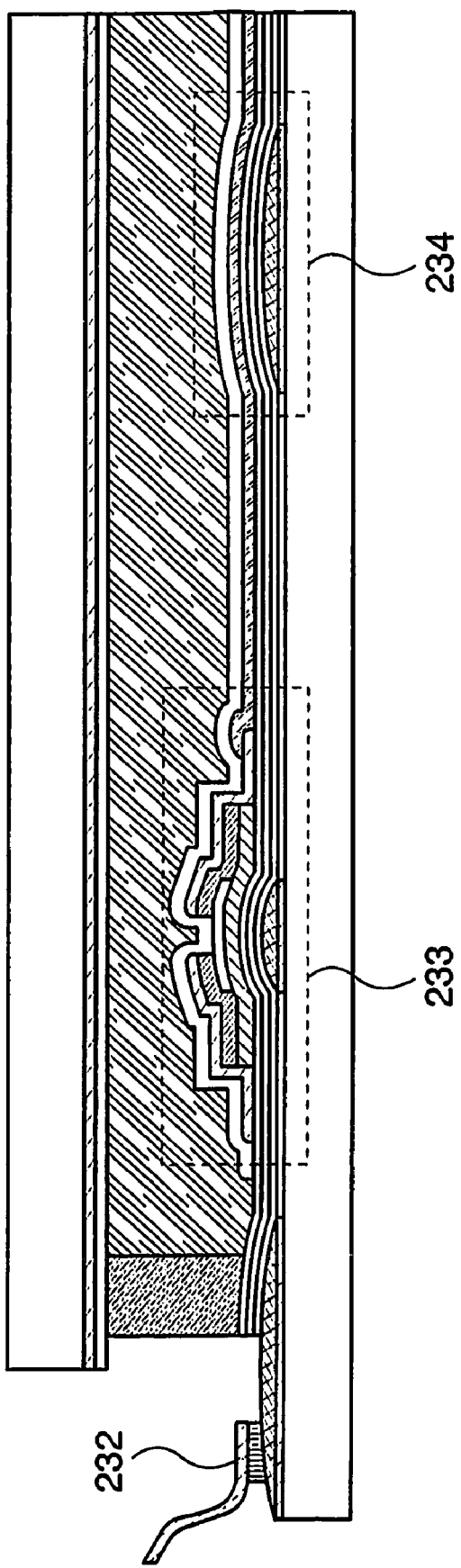
FIG. 7 shows a cross-sectional view illustrating a method for manufacturing a liquid crystal display panel according to the invention.

Next, the insulating layer formed in the same layer as that of the gate insulating layer 207 over the wiring 202 are removed by carrying out ashing treatment using an oxygen gas under the atmospheric pressure or pressure near to the atmospheric pressure (see FIG. 7). This treatment is carried out by using an oxygen gas and one or more gas of hydrogen, $CF_4$, $NF_3$, $H_2O$, and $CHF_3$. In this step, ashing treatment is carried out after sealing by using the opposite substrate to prevent damage or breakdown due to static electricity; however, when there are few effects of static, ashing treatment may be carried out at any timing.

Subsequently, a wiring board 232 for connecting to an external circuit and the wiring 202 are electrically connected.

Through the above steps, a liquid crystal display panel including a channel protective type switching TFT 233 and a capacitor element 234 is completed. The capacitor element 234 is formed of the capacitor wiring 204, the gate insulating layer, and the first electrode 224.

As mentioned above, in this embodiment mode, a liquid crystal display device can be manufactured by manufacturing a TFT without a light-exposure step using a photomask. A part or all of the treatment such as application of a resist, light-exposure, or development according to the light-exposure step can be skipped. In addition, a liquid crystal display device can be easily manufactured by forming each kind of patterns directly over a substrate with a droplet discharged method even when a glass substrate after fifth generation, one side of which exceeds 1000 mm.

Embodiment Mode 2

Embodiment mode 1 shows a structure in which a first electrode 224 and a wiring 220 connected to at least one of a source or a drain are connected directly; however, an insulating layer may be provided therebetween as another mode.

Figure 8A:
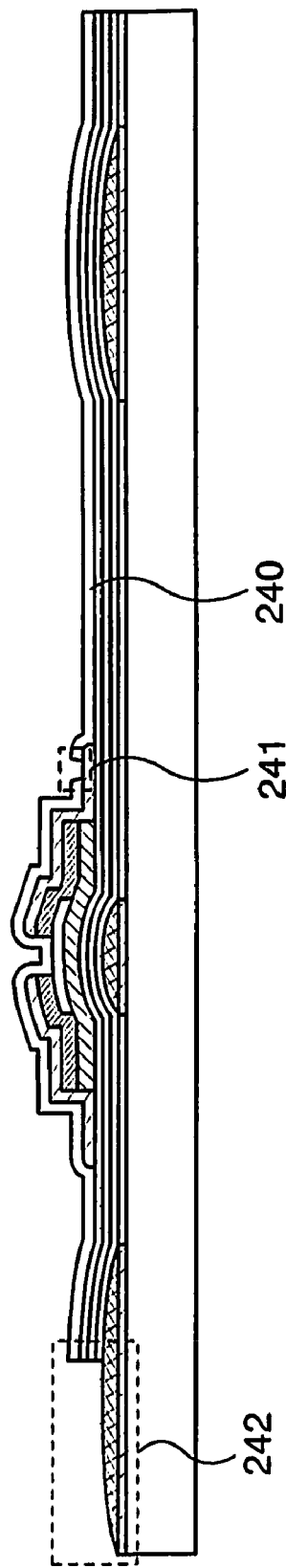
FIGS. 8A and 8B each show cross-sectional views illustrating a method for manufacturing a liquid crystal display panel according to the invention.

In this case, an insulating layer 240 functioning as a protective film is formed when the steps up to FIG. 5C is finished (see FIG. 8A). A film to be formed of silicon nitride or silicon oxide formed by a sputtering method or a plasma CVD method may be applied to this protective film. It is necessary to form an opening 241 in the insulating layer 240, and the wiring 220 connected to at least one of the source and the drain is electrically connected to the first electrode 224 through the opening 241 (see FIG. 8B). At the time of forming the opening 241, an opening 242 necessary for attaching a connection terminal later may be simultaneously formed. A TFT substrate 200 is thus completed.

A method for forming the openings 241 and 242 is not specifically limited; however, an opening can be selectively opened by, for example, plasma etching under the atmospheric pressure. After forming a mask with a droplet discharge method, wet etching treatment may be carried out. In addition, the insulating layer 240 having the openings 241 and 242 can be also directly formed by selectively forming an inorganic siloxane or organic siloxane-based film to be formed by a droplet discharge method.

Figure 8B:
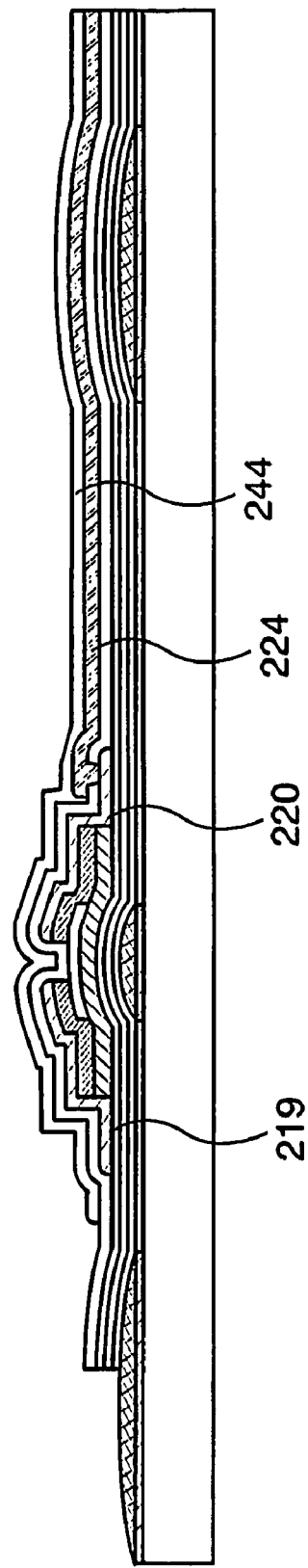
Figure 9:
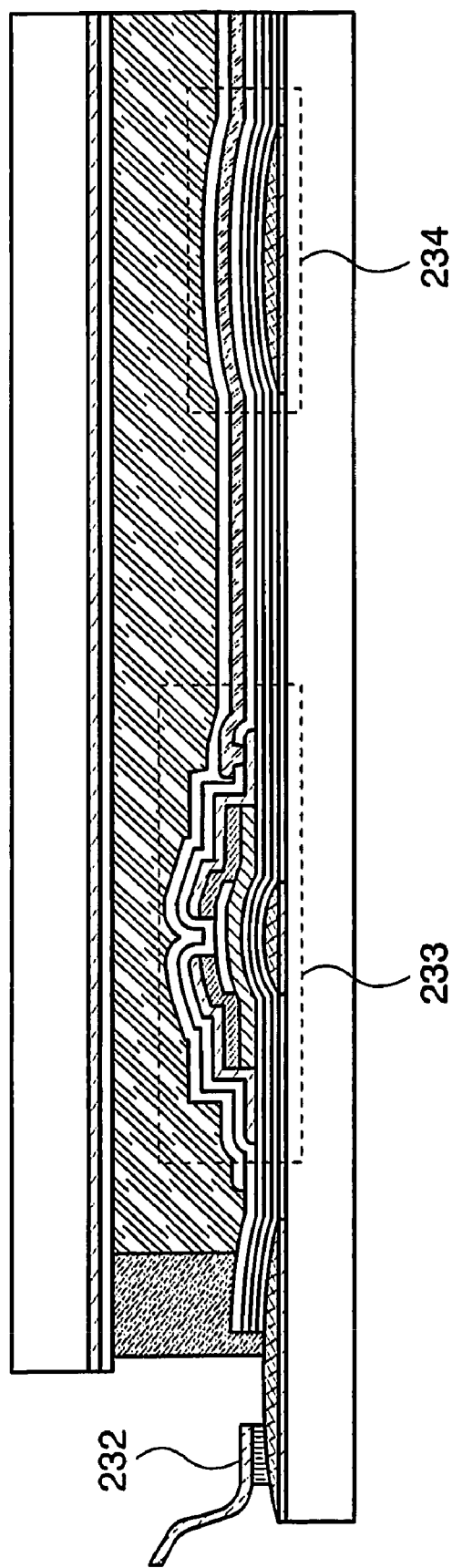
FIG. 9 shows a cross-sectional view illustrating a method for manufacturing a liquid crystal display panel according to the invention.

An alignment film 244 is formed as shown in FIG. 8B. Then, as well as in Embodiment Mode 1, an opposite substrate is fixed to the TFT substrate 200 by using the sealant, and a liquid crystal is injected. Thus, a liquid crystal display panel shown in FIG. 9 is completed.

Embodiment Mode 3

A method for manufacturing a channel etched type thin film transistor and a liquid crystal display device with the use thereof are explained in Embodiment Mode 3.

A wiring 202, a gate electrode 203, and a capacitor wiring 204 are formed over a substrate 100. These are formed by directly drawing a composition containing conductive substance over the substrate 100 with a droplet discharge method. Next, a gate insulating layer 207 is formed to have a single layer structure or a laminated structure by a plasma CVD method or a sputtering method. A specifically preferable mode is a lamination body of three layers of a first insulating layer 208 including silicon nitride, a second insulating layer 209 including silicon oxide, and a third insulating layer 210 including silicon nitride. Furthermore, a semiconductor layer 211 functioning as an active layer is formed. The above-mentioned steps are the same as those in Embodiment Mode 1.

Figure 10A:
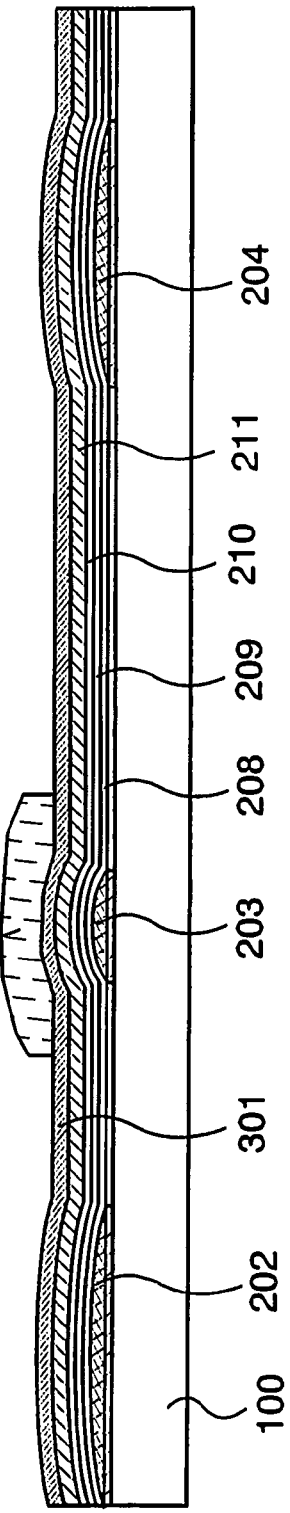
FIGS. 10A to 10C each show cross-sectional views illustrating a method for manufacturing a liquid crystal display panel according to the invention.
Figure 10B:
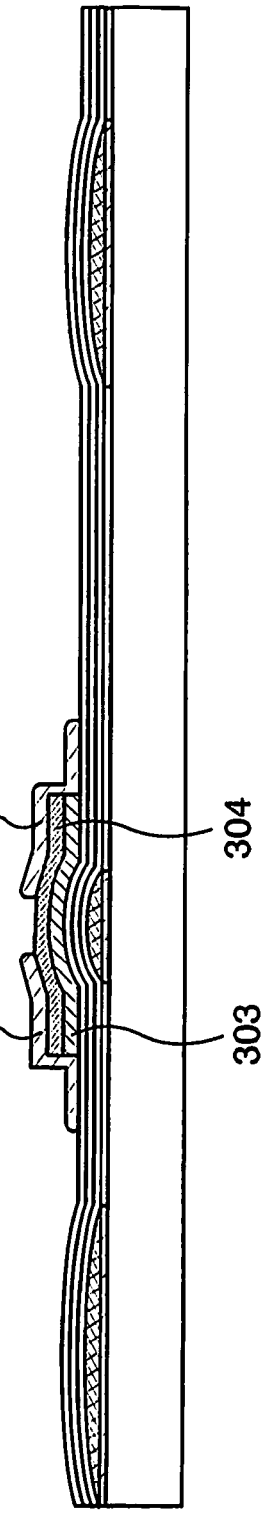

An n-type semiconductor layer 301 is formed over the semiconductor layer 211 (see FIG. 10A). Next, a mask 302 is formed by selectively discharging a composition over the n-type semiconductor layer 301. Subsequently, the semiconductor layer 211 and the n-type semiconductor layer 301 are simultaneously etched by using the mask 302, and a semiconductor layer 303 and an n-type semiconductor layer 304 are formed. Thereafter, wirings 305 and 306 connected to at least one of a source and a drain are formed over the n-type semiconductor layer 304 by a droplet discharge method (see FIG. 10B).

Figure 10C:
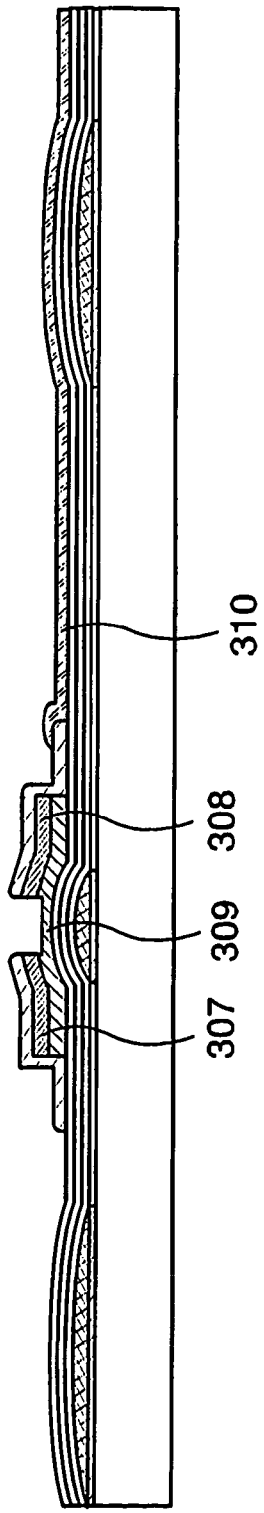

Next, using the wirings 305 and 306 connected to at least one of the source and the drain as the masks, the n-type semiconductor layer 304 is etched, and n-type semiconductor layers 307 and 308 are formed. The semiconductor layer 303 is slightly etched too, and a semiconductor layer 309 partly etched in an opening is formed. Subsequently, a first electrode 310 is formed to electrically connect to the wiring 306 connected to at least one of the source or the drain (see FIG. 10C).

Figure 11:
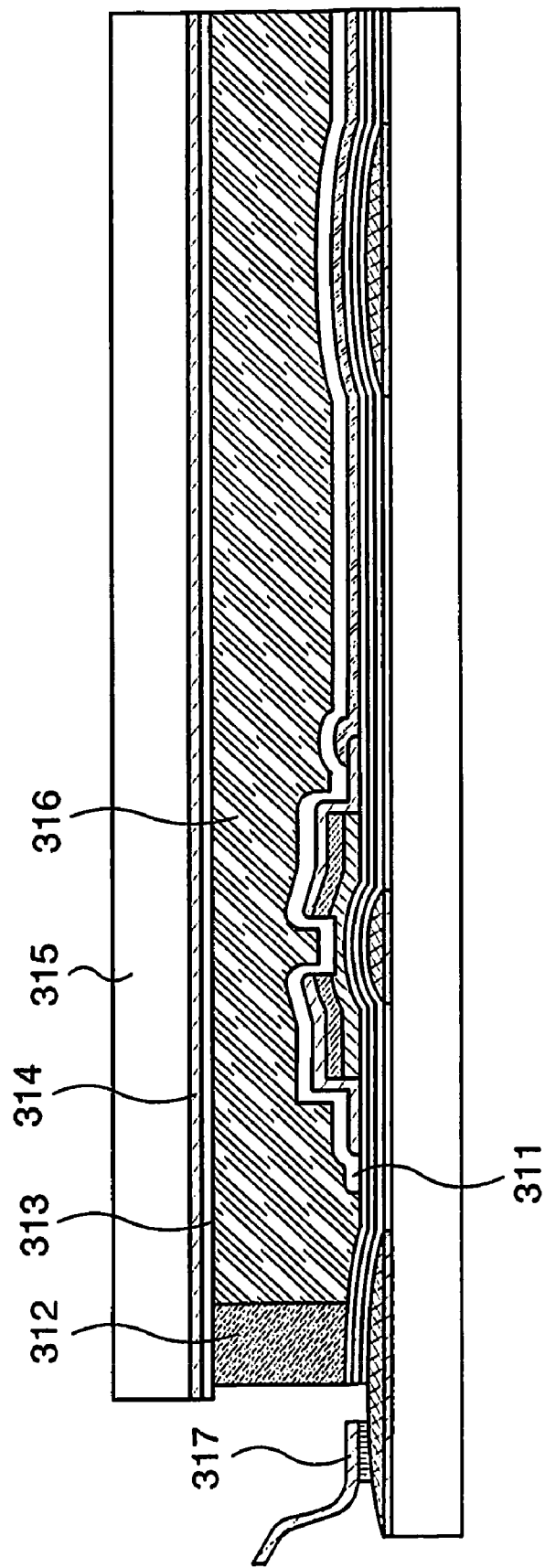
FIG. 11 shows a cross-sectional view illustrating a method for manufacturing a liquid crystal display panel according to the invention.

Next, an insulating layer 311 functioning as an alignment film is formed. Subsequently, a sealant 312 is formed, and the substrate 100 and a substrate 315 in which an opposite electrode 314 and an alignment film 313 are formed are attached by using the sealant 312. Thereafter, a liquid crystal layer 316 is formed between the substrate 100 and the substrate 315. Next, a region to be attached a connection terminal 317 is exposed by etching under the atmospheric pressure or pressure near to the atmospheric pressure, and the connection terminal 317 is attached. Accordingly, a liquid crystal display device can be manufactured (see FIG. 11).

In this embodiment mode, a liquid crystal display device can be manufactured by manufacturing a TFT without a light-exposure step using a photomask. A part or all of the treatment such as application of a resist, light-exposure, or development according to the light-exposure step can be skipped. In addition, a liquid crystal display device can be easily manufactured by forming each kind of patterns directly over a substrate with a droplet discharged method even when a glass substrate after fifth generation, one side of which exceeds 1000 mm.

Embodiment Mode 4

Figure 19:
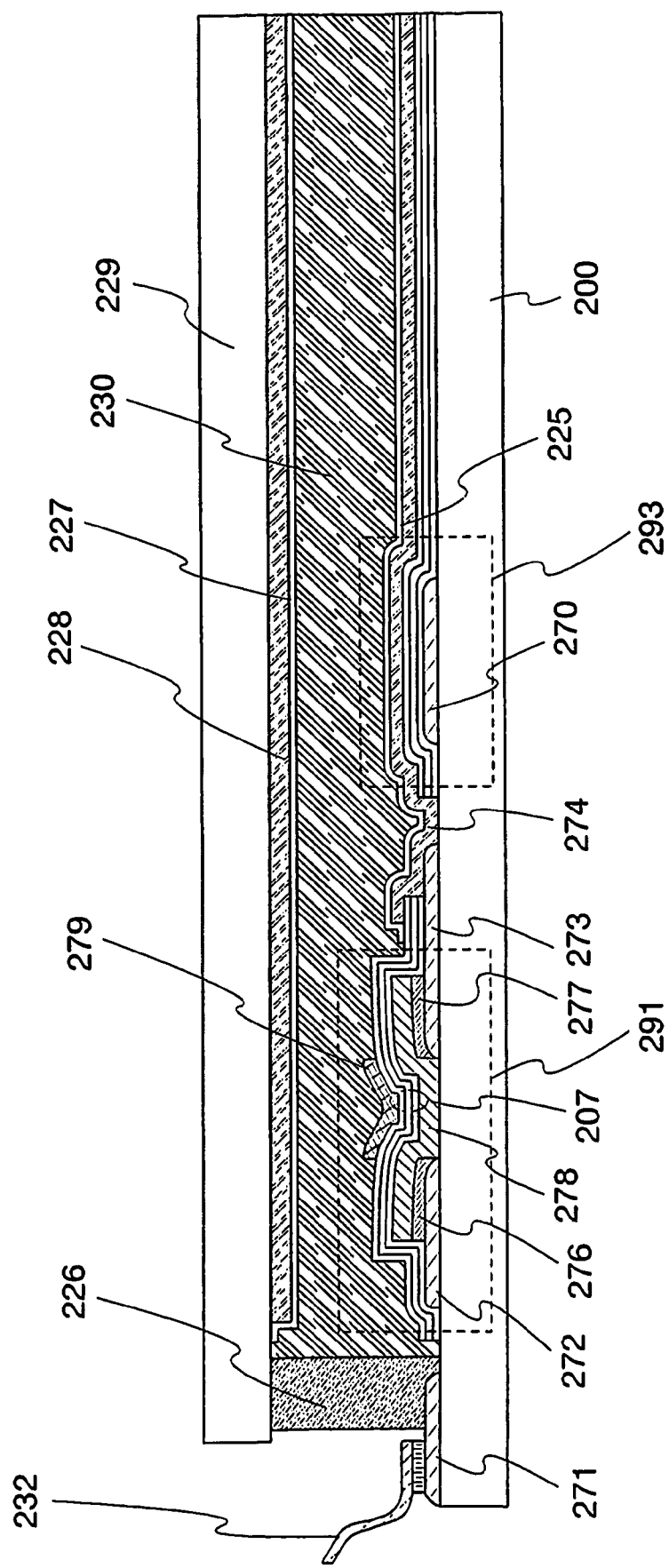
FIG. 19 shows a cross-sectional view illustrating a liquid crystal display panel according to the invention.

A top gate type TFT manufactured by a droplet discharge method and a liquid crystal display device with the use thereof are explained in Embodiment Mode 4 with reference to FIG. 19.

A switching TFT 291 and a capacitor portion 293 are formed over a TFT substrate 200. The switching TFT 291 and the capacitor portion 293 can be manufactured in the following step.

First, a capacitor wiring 270, wirings 271 and 272 connected to at least one of a source and a drain, and wiring 273 are formed by a droplet discharge method. A composition containing particles of a metal such as silver, gold, copper, tungsten, or aluminum is used for the conductive substance which forms these layers. Specifically, the wirings connected to at least one of the source and the drain are preferable to be low resistance. Therefore, a material in which any one of gold, silver, or copper dissolved or dispersed in a solvent is preferably used, and more preferably silver or copper with low resistance is used in consideration of a specific resistance value. Nanoparticles of which particle size is from 5 nm to 10 nm is preferable to be used to form this wiring. A solvent corresponds to organic solvent such as esters like butyl acetate, alcohols like isopropyl alcohol, or acetone. Surface tension and viscosity may be appropriately adjusted by adjusting concentration of a solution and adding a surface activator or the like.

N-type semiconductor layers 276 and 277 are formed to be in contact with the wirings 272 and 273 connected to at least one of the source and the drain. Then, a semiconductor layer 278 is formed by an AS or an SAS. An AS or an SAS is formed with a vapor phase growth method or a sputtering method. When a plasma CVD method, a kind of the vapor phase growth method, is used, an AS is formed by using $SiH_4$ which is a semiconductor material gas or a mixed gas of $SiH_4$ and $H_2$. In addition, an SAS is formed by the mixed gas by diluting $SiH_4$ with $H_2$ by from 3 times to 1000 times. In the SAS formed by diluting $SiH_4$ with $H_2$, a crystal is much more developed on a developed surface of an SAS film than on a substrate interface. Therefore, a combination with a top gate type TFT in which a gate insulating layer 207 is formed over the semiconductor layer 278 is suitable.

The semiconductor layer 278 is formed by an AS or an SAS film over the entire surface of the substrate 100, and processed into a predetermined shape using a mask formed by a droplet discharged method. The position of the semiconductor layer 278 is given corresponding to the wirings 272 and 273 connected to at least one of the source and the drain. In other words, the semiconductor layer 278 is formed to overlap with the wirings 272 and 273 connected to at least one of the source and the drain. At this time, the n-type semiconductor layers 276 and 277 are sandwiched between the semiconductor layer 278 and the wirings 272 and 273 connected to at least one of the source and the drain, respectively.

Then, the gate insulating layer 207 is formed to have a single layer structure or a laminated structure by using a plasma CVD method or a sputtering method. As a specifically preferable mode, the gate insulating layer has a structure of a lamination body of three layers including a first insulating layer 208 made from silicon nitride, a second insulating layer 209 made from silicon oxide, and a third insulating layer 210 made from silicon nitride. In addition, the gate insulating layer 207 is also used as an insulating layer which forms a storage capacitor by covering the capacitor wiring 270.

A gate electrode 279 is formed over the gate insulating layer 207 with a droplet discharge method. A composition containing particles of a metal such as silver, gold, copper, tungsten, or aluminum can be used for a conductive substance which forms the gate electrode 279. After drawing the gate electrode 279 and a pattern of the wirings connected thereto, the gate electrode 279 is completed by baking.

The gate insulating layer 207 is etched so that the wirings 271 and 273 are at least partially exposed. Then, a first electrode 274 is formed by selectively discharging a composition containing a conductive substance to be electrically connected to the wiring 273. This first electrode 274 serves as a pixel electrode in a liquid crystal display device. In the case of manufacturing a transmission type liquid crystal display device, the first electrode 274 includes a composition containing indium tin oxide (ITO), indium tin oxide containing silicon oxide (ITSO), zinc oxide (ZnO), tin oxide ($SnO_x$), or the like. In addition, the first electrode 274 includes indium tin oxide (ITO), indium tin oxide containing silicon oxide (ITSO), zinc oxide (ZnO), or the like with a sputtering method. More preferably, indium tin oxide containing silicon oxide which is formed with a sputtering method by using a target in which 2 wt. % to 10 wt. % of silicon oxide is contained in ITO may be used. Furthermore, in the case of manufacturing a reflection type liquid crystal display device, the first electrode 274 includes a composition containing particles of a metal such as silver, copper, or aluminum in a predetermined pattern.

As mentioned above, the TFT substrate 200 over which the top gate type (also referred to as a stagger type) switching TFT 291 and the capacitor portion 293 are provided can be obtained. An insulating layer 225 referred to as an alignment film is formed over the first electrode 274. The insulating layer 225 can be formed in accordance with a shape of the first electrode 274 by using a screen printing method or an offset printing method. Thereafter, an opposite substrate 229 over which an insulating layer 227 functioning as an alignment film and a second electrode 228 functioning as an opposite electrode are provided is attached to the TFT substrate 200 with a spacer therebetween, and a liquid crystal layer 230 is provided in the space. A filler may be contained in a sealant 226, and further, a color filter, a shielding film (black matrix), or the like may be formed over the opposite substrate 229. Note that a dispenser type (a dropping type) or a dip type (a pumping up type) that is a method of injecting a liquid crystal by using a capillary phenomenon after attaching the opposite substrate 229 can be used as a method for forming the liquid crystal layer 230.

A closed loop is formed with the sealant 226 in a liquid crystal drip injection method to which a dispenser type is applied, and a liquid crystal is dropped once or several times therein. Subsequently, the substrates are attached in vacuum, and then cured by UV irradiation to make a state filled with liquid crystals after carrying out ultraviolet curing. A wiring board 232 for connection is provided so as to be electrically connected the wiring 271. The wiring board 232 provides a signal or power from outside.

According to this embodiment mode, a liquid crystal display device can be manufactured by manufacturing a TFT without a light-exposure step using a photomask. In this embodiment mode, a part or all of the treatment such as application of a resist, light-exposure, or development according to the light-exposure step can be skipped. In addition, a liquid crystal display device can be easily manufactured by forming each kind of patterns directly over a substrate with a droplet discharged method even when a glass substrate after fifth generation, one side of which exceeds 1000 mm.

Embodiment Mode 5

In liquid crystal display panels manufactured by Embodiment Mode 1, Embodiment Mode 2, and Embodiment Mode 3, as explained in FIG. 3, a scanning line driver circuit can be formed over a substrate 100 by forming a semiconductor layer from SAS.

Figure 20:
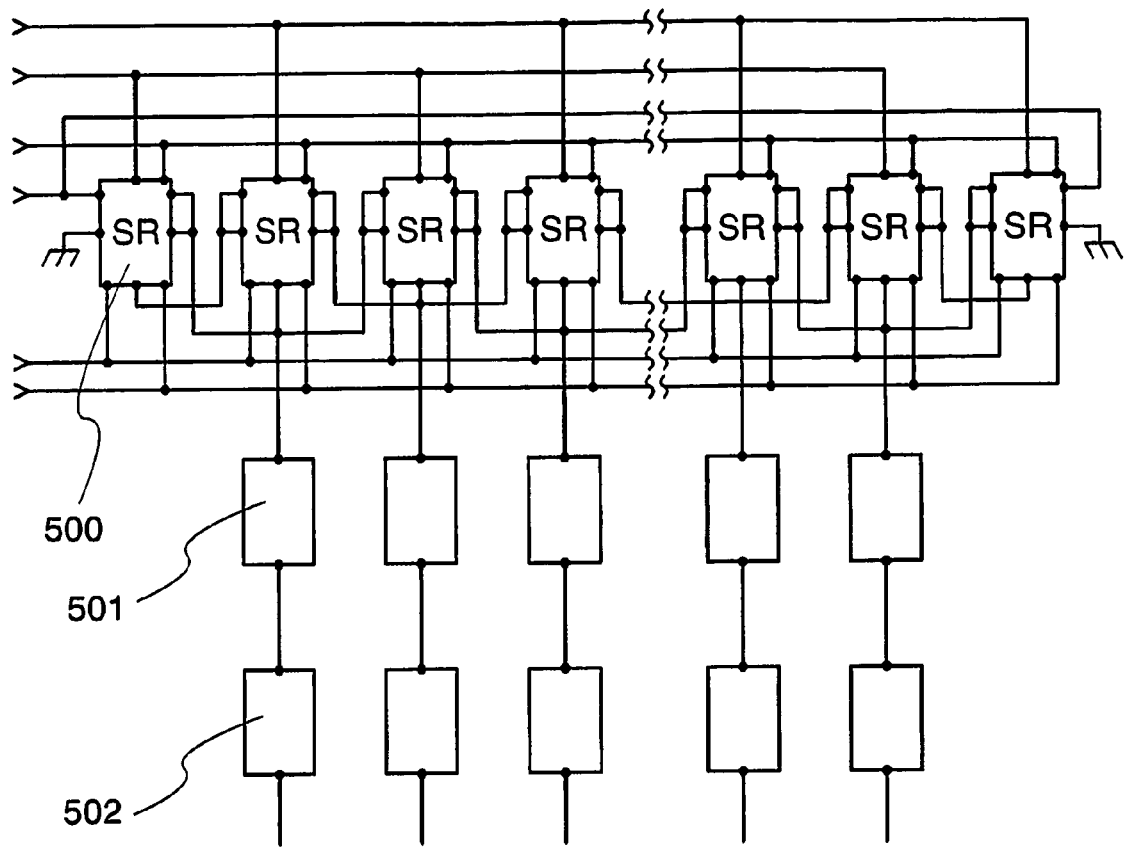
FIG. 20 shows a diagram illustrating a circuit structure in the case of forming a scanning line driver circuit with a TFT in a liquid crystal display panel according to the invention.

FIG. 20 shows a block diagram of the scanning line driver circuit composed of n-channel type TFTs using the SAS in which electric field effect mobility of from 1 $cm^2/V \cdot sec$ to 15 $cm^2/V \cdot sec$ can be obtained.

A block shown in reference numeral 500 corresponds to a pulse output circuit outputting a sampling pulse for one step in FIG. 20, and a shift register is composed of n pieces of pulse output circuit. Reference numeral 501 denotes a buffer circuit, and a pixel 502 is connected at the ends thereof.

Figure 21:
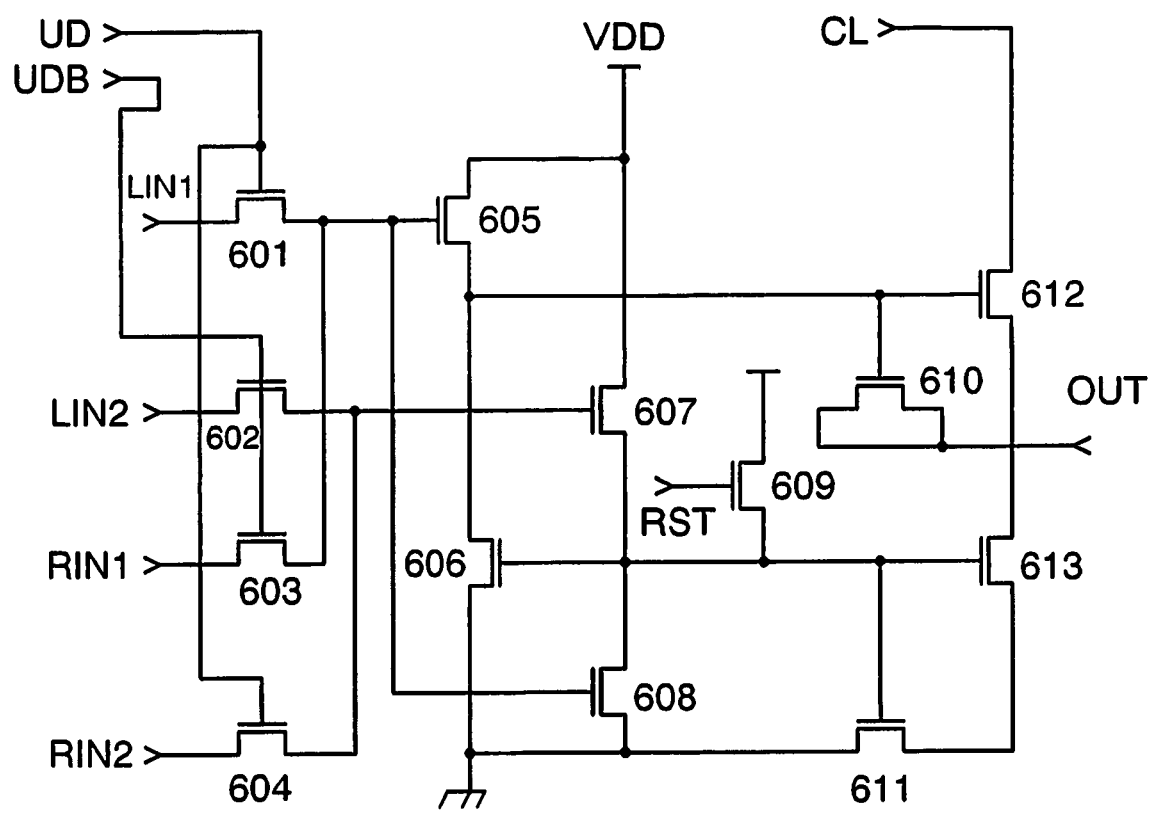
FIG. 21 shows a diagram illustrating a circuit structure in the case of forming a scanning line driver circuit with a TFT in a liquid crystal display panel according to the invention (a shift register circuit)

FIG. 21 shows a specific structure of the pulse output circuit 500, and the circuit is composed of n-channel type TFTs 601 to 613. At this time, the size of the TFTs may be decided in consideration of an operating characteristic of the n-channel type TFTs using SAS. For example, when a channel length is set to be 8 μm, the channel width can be set ranging from 10 μm to 80 μm.

Figure 22:
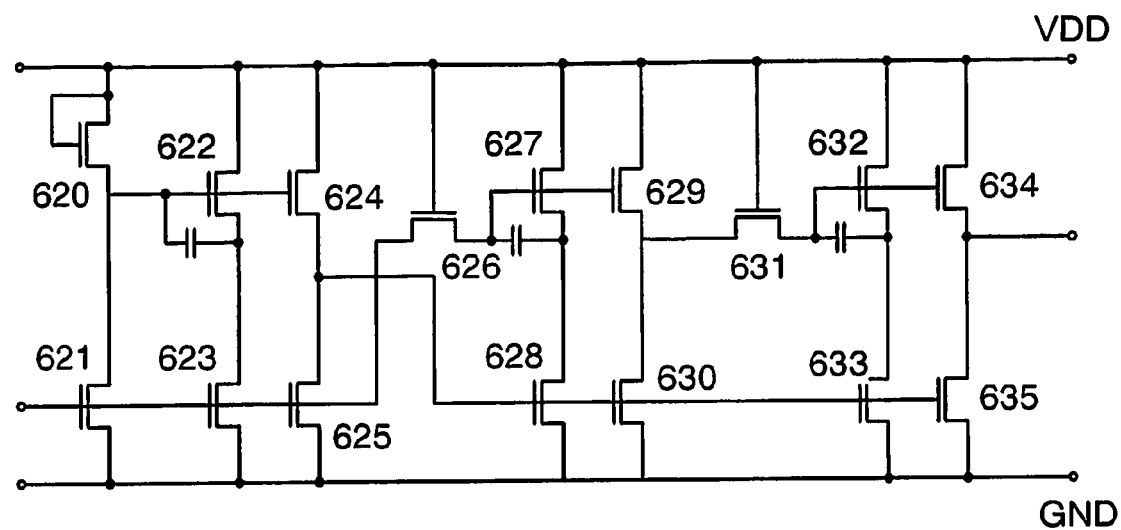
FIG. 22 shows a diagram illustrating a circuit structure in the case of forming a scanning line driver circuit with a TFT in a liquid crystal display panel according to the invention (a buffer circuit)

In addition, FIG. 22 shows a specific structure of the buffer circuit 501. The buffer circuit is composed of n-channel type TFTs 620 to 635 in the same manner. At this time, the size of the TFTs may be decided in consideration of an operating characteristic of the n-channel type TFTs using SAS. For example, when a channel length is set to be 10 μm, the channel width can be set ranging from 10 μm to 1800 μm.

Figure 12:
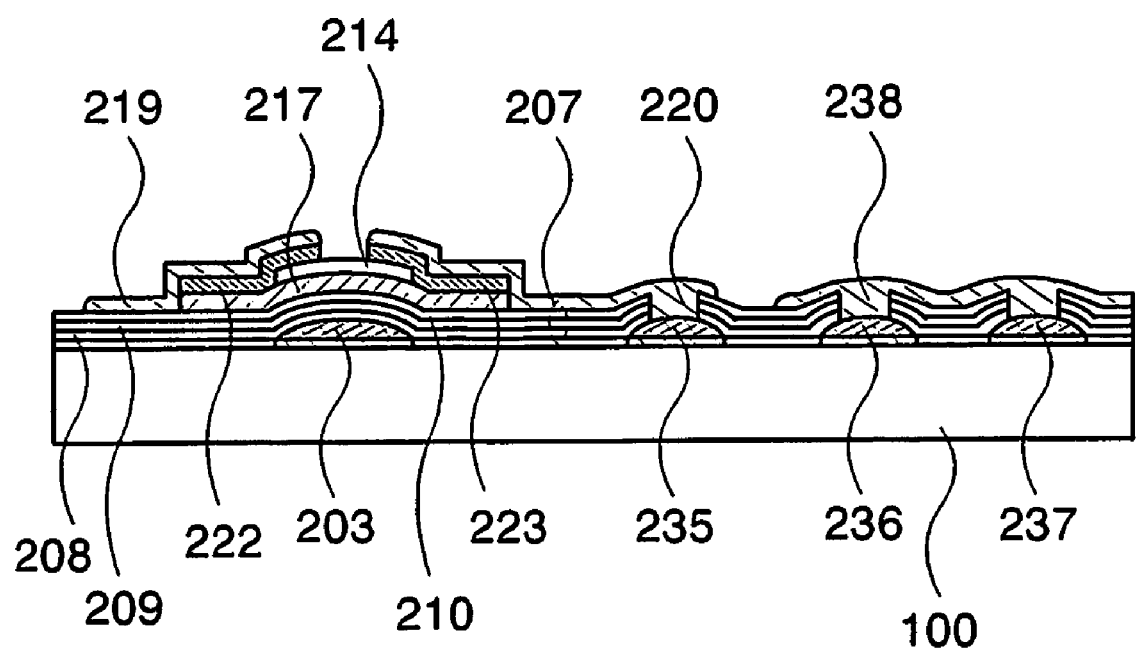
FIG. 12 shows a cross-sectional view illustrating a method for manufacturing a liquid crystal display panel according to the invention.

It is necessary to connect the TFTs with each other by wirings to realize such a circuit, and FIG. 12 shows a structure example of wirings in the case thereof. FIG. 12 shows a state in which a gate electrode 203, a gate insulating layer 207, a semiconductor layer 217 formed from an SAS, an insulating layer 214 which forms a channel protective layer, n-type semiconductor layers 222 and 223 which forms a source and a drain, and wirings 219 and 220 connected to at least one of the source and the drain are formed. In this case, connection wirings 235, 236, and 237 and gate electrode 203 are formed over the substrate 100 in the same step. Openings are provided in the gate insulating layer 207 so that the connection wirings 235, 236, and 237 are exposed. Various kinds of circuits can be realized by connecting the TFTs appropriately by the wirings 219 and 220 connected to the source and the drain and a connection wiring 238 formed in the same step.

Embodiment Mode 6

Figure 26:
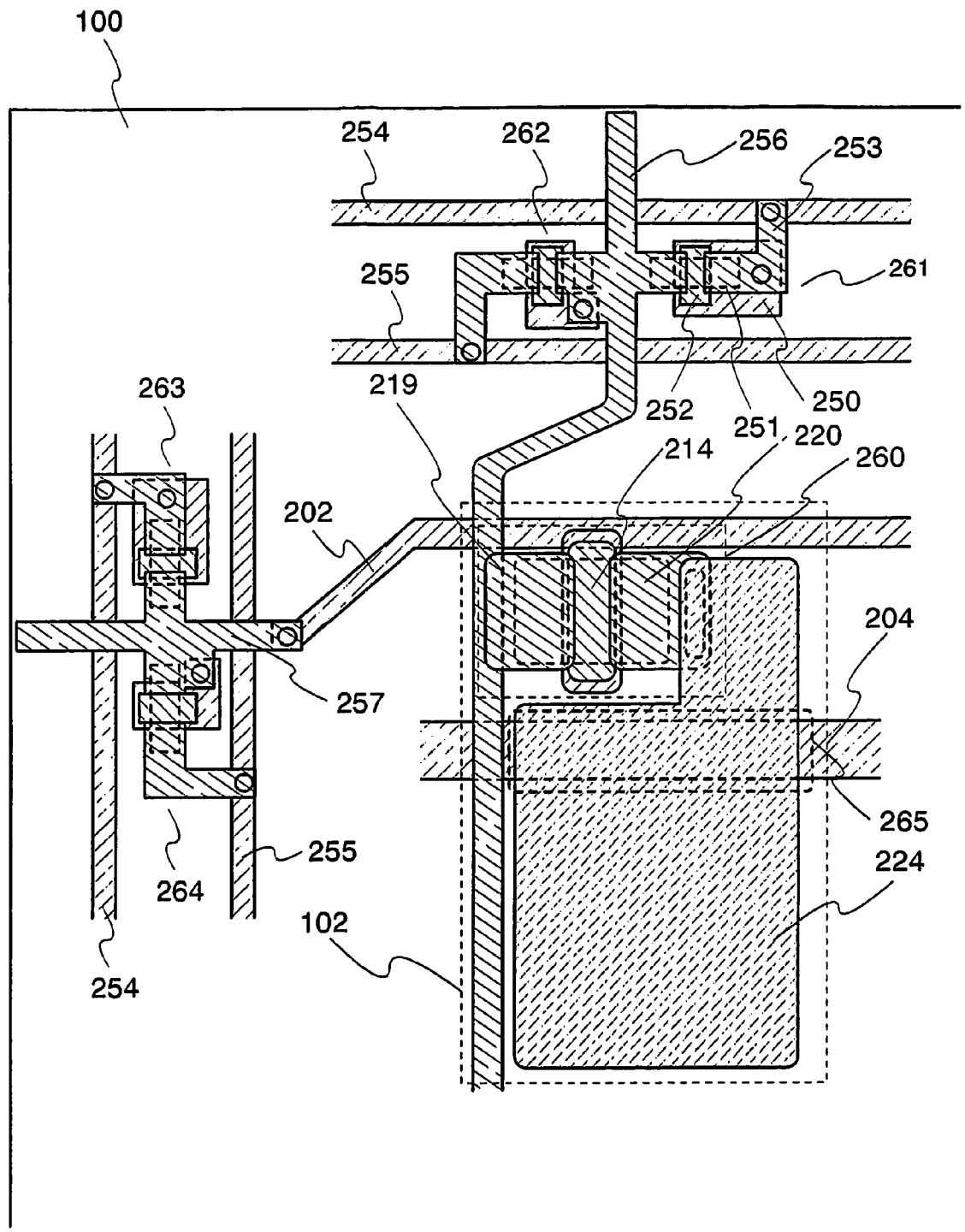
FIG. 26 shows a top view illustrating a liquid crystal display panel according to the invention.

One mode in which a protective diode is provided for a scanning line input terminal portion and a signal line input terminal portion is explained with reference to FIG. 26. A TFT 260 and a capacitor element 265 are provided for a pixel 102 in FIG. 26. The TFT 260 and the capacitor element 265 have the same structure as the switching TFT 233 and the capacitor element 234 in Embodiment Mode 1, respectively.

Figure 27:
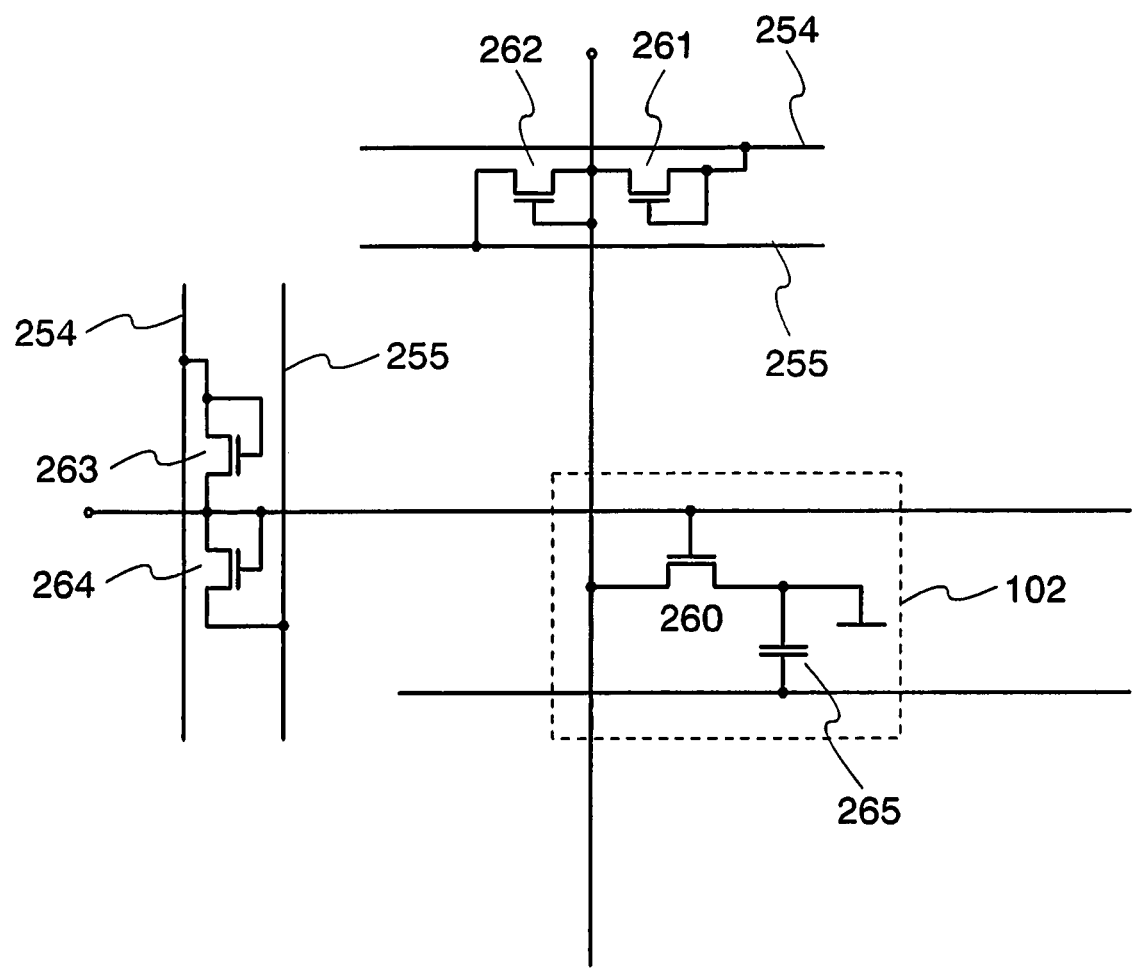
FIG. 27 shows an equivalent circuit diagram of a liquid crystal display panel illustrated in FIG. 26.

Protective diodes 261 and 262 are provided for the signal line input terminal portion. These protective diodes are manufactured in the same step as that of the TFT 260 and being operated as a diode by being each connected to a gate and one of a drain or a source. FIG. 27 shows an equivalent circuit diagram of a top view shown in FIG. 26.

The protective diode 261 includes a gate electrode 250, a semiconductor layer 251, an insulating layer for channel protection 252, and a wiring 253. The protective diode 262 has the same structure. Common potential lines 254 and 255 connecting to this protective diode are formed in the same layer as that of the gate electrode. Therefore, it is necessary to form a contact hole in a gate insulating layer to electrically connect to the wiring 253.

A mask may be formed by a droplet discharge method and etching process may be carried out to form a contact hole in the gate insulating layer. In this case, when etching process by atmospheric pressure discharge is applied, local discharge process is also possible, and it does not need to form a mask over an entire surface of a substrate.

The protective diode 261 or 262 is formed in the same layer as that of a wiring 219 connected to the source and the drain in the TFT 260 and has a structure in which a wiring 256 connected thereto is connected to a source side or a drain side.

The input terminal portion of the scanning signal line side also has the same structure. Protective diodes 263 and 264 are provided for the scanning line input terminal portion. These protective diodes are manufactured in the same step as that of the TFT 260 and operated as a diode by being each connected to the gate and one of the drain or the source. According to the present invention, the protective diodes provided in an input stage can be formed at the same time. Note that the position of depositing a protective diode is not limited to this embodiment mode and can be also provided between a driver circuit and a pixel as shown in FIG. 3.

Embodiment Mode 7

Figure 17A:
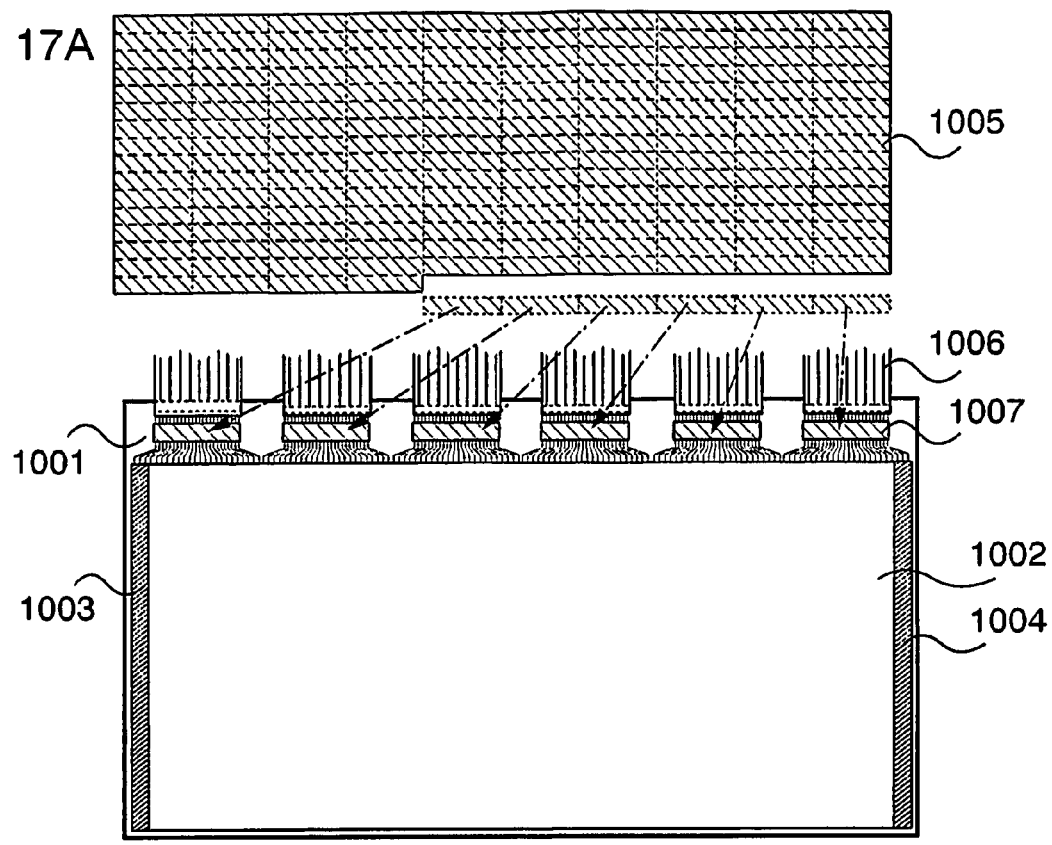
FIGS. 17A and 17B each show a mounting method (a COG method) of a driver circuit of a liquid crystal display panel according to the invention.
Figure 17B:
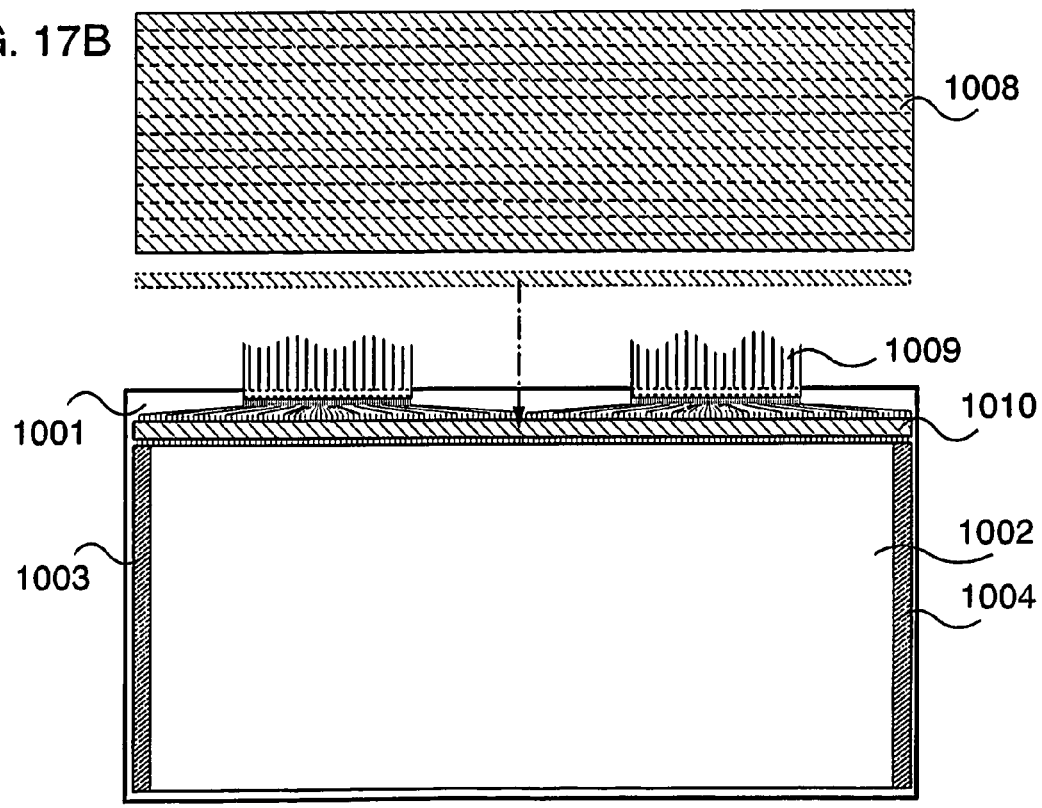

First, a liquid crystal display device to which a COG method is applied is explained with reference to FIGS. 17A and 17B. FIGS. 17A and 17B each show a liquid crystal display device in which a pixel portion 1002 displaying information such as a character or an image and scanning line driver circuits 1003 and 1004 are provided over a substrate 1001.

In FIG. 17A, individual driver circuit (hereinafter referred to as a driver IC) is taken out by separating a mother substrate 1005 over which a plurality of driver circuits is formed. The same glass substrate used for a liquid crystal display device can be used for the mother substrate 1005. For example, driver ICs 1007 can be obtained by forming a plurality of driver ICs on a rectangular glass substrate of which one side is, for example, from 300 mm to 1000 mm or more and by separating it. The driver ICs 1007 are separated by forming it in a rectangular shape of which major axis is from 15 mm to 80 mm and minor axis is from 1 mm to 6 mm in consideration of a length of one side of the pixel portion or a pixel pitch. A cost of part can be reduced by forming the driver ICs over the mother substrate 1005 with a TFT using a crystalline semiconductor film.

FIG. 17A shows a mode in which a plurality of the driver ICs 1007 is mounted on the substrate 1001 and has a structure in which a signal is inputted from an external circuit by connecting a flexible wiring 1006 at the end of the driver ICs 1007. FIG. 17B shows a structure in which a long driver IC 1010 cut from a large-sized substrate 1008 is mounted on the substrate 1001. A mode in which a flexible wiring 1009 is mounted on at the end of the long driver IC 1010 is shown. The number of parts can be reduced and the number of steps can be reduced by using such a long driver IC.

Figure 18A:
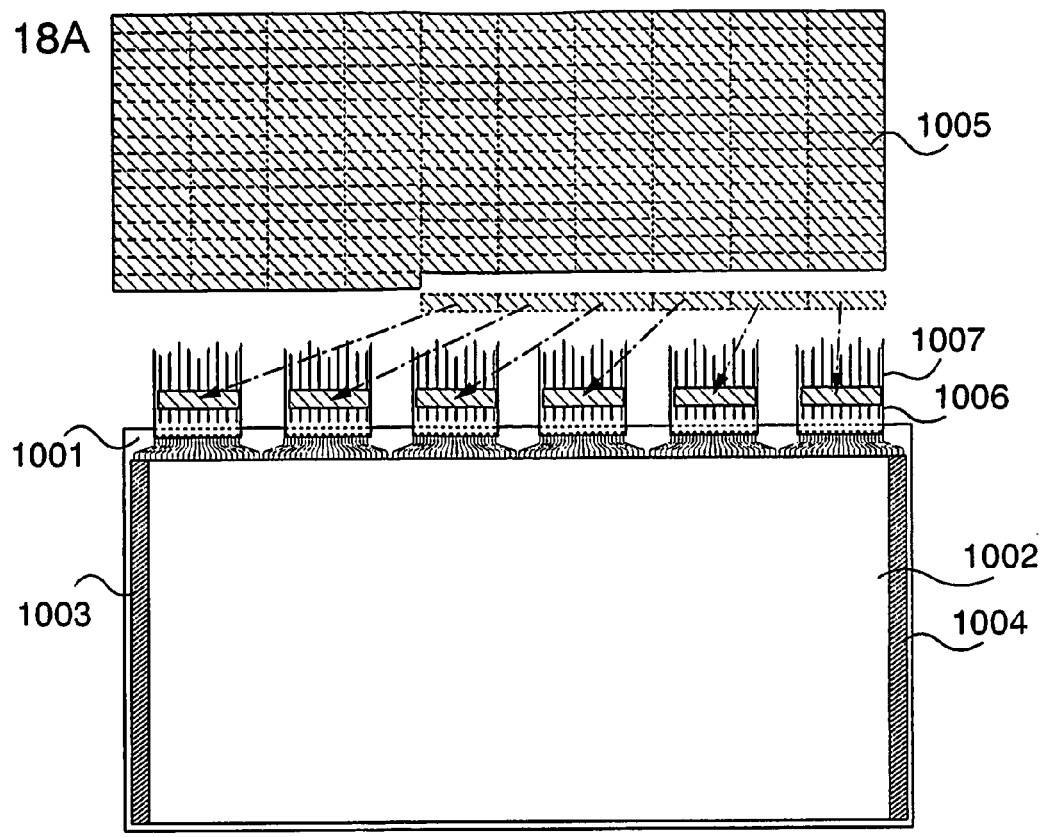
FIGS. 18A and 18B each show a mounting method (a TAB method) of a driver circuit of a liquid crystal display panel according to the invention.
Figure 18B:
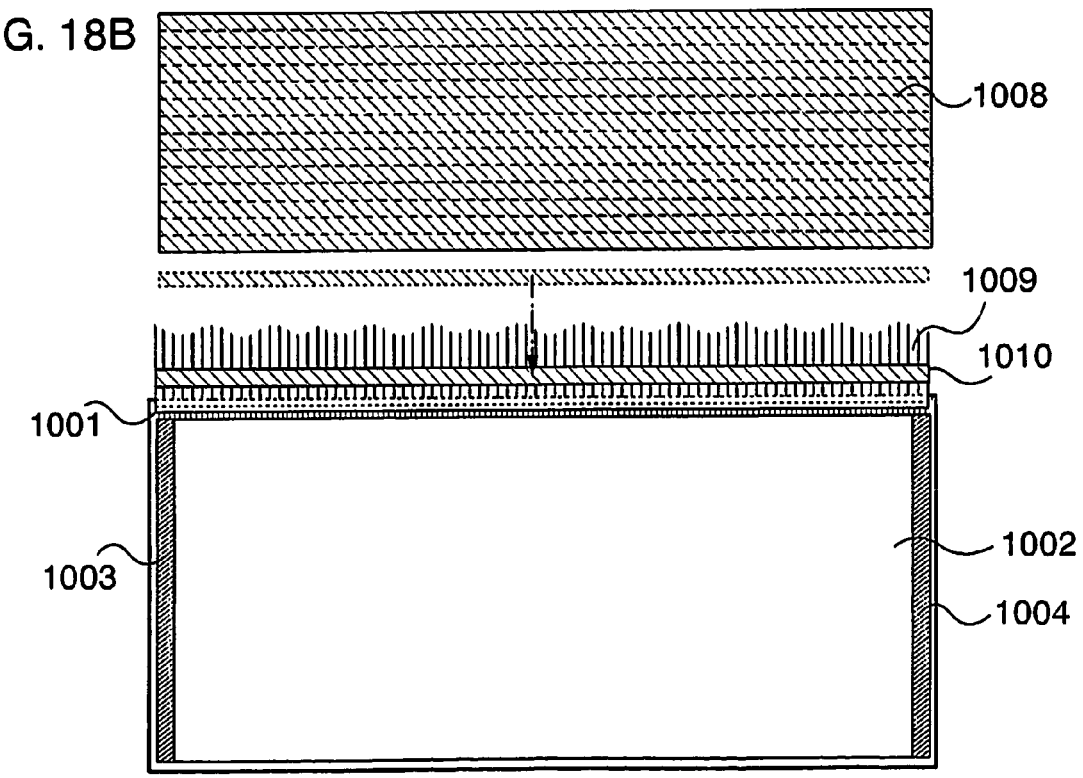

Next, a liquid crystal display device to which a TAB method is adopted is explained with reference to FIGS. 18A and 18B. A pixel portion 1002 and scanning line driver circuits 1003 and 1004 are provided over a substrate 1001. In FIG. 18A, a plurality of flexible wirings 1006 is attached to the substrate 1001. Driver ICs 1007 are mounted on the flexible wirings 1006. FIG. 15B shows a mode in which a flexible wiring 1009 is attached to the substrate 1001 and a driver IC 1010 is mounted on the flexible wiring 1009. In the case of applying the latter, metal pieces or the like that fixes the driver IC 1010 may be attached together in respect of intensity. The number of parts can be reduced and the number of steps can be reduced by using such a long driver IC.

The restriction specifically on a length of a major axis is relieved by forming the driver IC over the glass substrate as in FIGS. 17A and 17B and FIGS. 18A and 18B, and less number necessary for mounting corresponding to the pixel region 1002 is needed. In other words, a long driver IC formed to include single crystal silicon cannot be realized due to mechanical strength or restriction of a substrate. When a driver IC is formed over a glass substrate, the driver IC does not lose productivity since it is not limited to a shape of a substrate used as a mother body. This is a large predominant respect as compared with the case of taking out IC chips from a circular silicon wafer.

The driver ICs 1007 and 1010 shown in FIGS. 17A and 17B and FIGS. 18A and 18B are signal line driver circuits. In order to form a pixel region corresponding to a RGB full color, 3072 signal lines in a XGA class and 4800 signal lines in a UXGA class are necessary. The signal lines of such a number forms a leading out line by dividing into several blocks at an edge of the pixel region 1002 and is gathered in accordance with a pitch of an output terminal of the driver IC 1007.

The driver IC is preferably formed to include a crystalline semiconductor over a substrate. The crystalline semiconductor formed by being irradiated with a continuous-wave laser is superior. Therefore, a continuous-wave solid state laser or a gas laser is used as an oscillator in which the laser light is generated. A transistor can be formed using a polycrystalline semiconductor layer with a large grain size having less crystal defect. In addition, high-speed driving is possible since mobility or a response speed is favorable, and it is possible to further improve an operating frequency of an element than that of the conventional element. Further, high reliability can be obtained since there are few properties variations. Note that a channel-length direction of a transistor and a scanning direction of laser light may be accorded with each other to further improve an operating frequency. This is because the highest mobility can be obtained when a channel length direction of a transistor and a scanning direction of laser light with respect to a substrate are almost parallel (preferably, from −30° to 30°) in a step of laser crystallization by a continuous-wave laser. A channel length direction coincides with a direction of current floating in a channel formation region, in other words, a direction in which an electric charge moves. The transistor thus manufactured has an active layer composed of a polycrystalline semiconductor layer in which a crystal grain is extended in a channel direction, and this means that a crystal grain boundary is formed almost along a channel direction.

In carrying out laser crystallization, it is preferable to narrow down the laser light considerably, and a beam spot thereof preferably has a width of approximately from 1 mm to 3 mm as same as that of a minor axis of the driver ICs. In addition, in order to ensure an enough and effective energy density to an object to be irradiated, an irradiated region of the laser light is preferably a linear shape. However, a linear shape here does not refer to a line in a proper sense, but refers to a rectangle or an oblong with a large aspect ratio. For example, the linear shape refers to a rectangle or an oblong with an aspect ratio of 2 or more (preferably from 10 to 10000). Accordingly, productivity can be improved by conforming a width of a beam spot of the laser light to that of a minor axis of the driver ICs.

In FIGS. 17A and 17B and FIGS. 18A and 18B, the scanning line driver circuit is integrally formed with the pixel portion and the driver IC is mounted as a signal line driver circuit. However, this embodiment mode is not limited thereto, and the driver IC may be mounted as both a scanning line driver circuit and a signal line driver circuit. In that case, it is preferable to differentiate a specification of the driver ICs to be used between the scanning line side and signal line side. For example, a withstand pressure of around 30 V is required for the transistor composing the scanning line driver ICs; however, a drive frequency is 100 kHz or less and a high speed operation is comparatively not required. Therefore, it is preferable to set a sufficiently long channel-length (L) of the transistor composing the scanning line driver. On the other hand, a withstand pressure of around 12 V is enough for the transistor of the signal line driver ICs; however, a drive frequency is around 65 MHz at 3 V and a high speed operation is required. Therefore, it is preferable to set a channel-length or the like of the transistor composing a driver with a micron rule.

In the pixel region 1002, the signal line and the scanning line are intersected to form a matrix and a transistor is arranged in accordance with each intersection. A TFT having a structure in which a channel is formed to include amorphous semiconductor or a semi-amorphous semiconductor can be used as the transistor arranged in the pixel portion 1002 in this embodiment mode. An amorphous semiconductor is formed by a method such as a plasma CVD method or a sputtering method. It is possible to form a semi-amorphous semiconductor at a temperature of 300° C. or less with plasma CVD. Therefore, a film thickness necessary to form a transistor is formed in a short time even in the case of a non-alkaline glass substrate of an external size of, for example, 550 mm×650 mm. The feature of such a manufacturing technique is effective in manufacturing a liquid crystal display device of a large-sized screen. In addition, a semi-amorphous TFT can obtain electron field-effect mobility of 1 $cm^2$/V·sec to 15 $cm^2$/V·sec by forming a channel formation region to include SAS. Therefore, this TFT can be used as a switching element of pixels and as an element which composes the scanning line driver circuit.

As mentioned above, the driver circuit can be incorporated into a liquid crystal display panel. According to this embodiment mode, a liquid crystal display device can be easily manufactured even by using a glass substrate after fifth generation, one side of which exceeds 1000 mm.

Embodiment Mode 8

Figure 23:
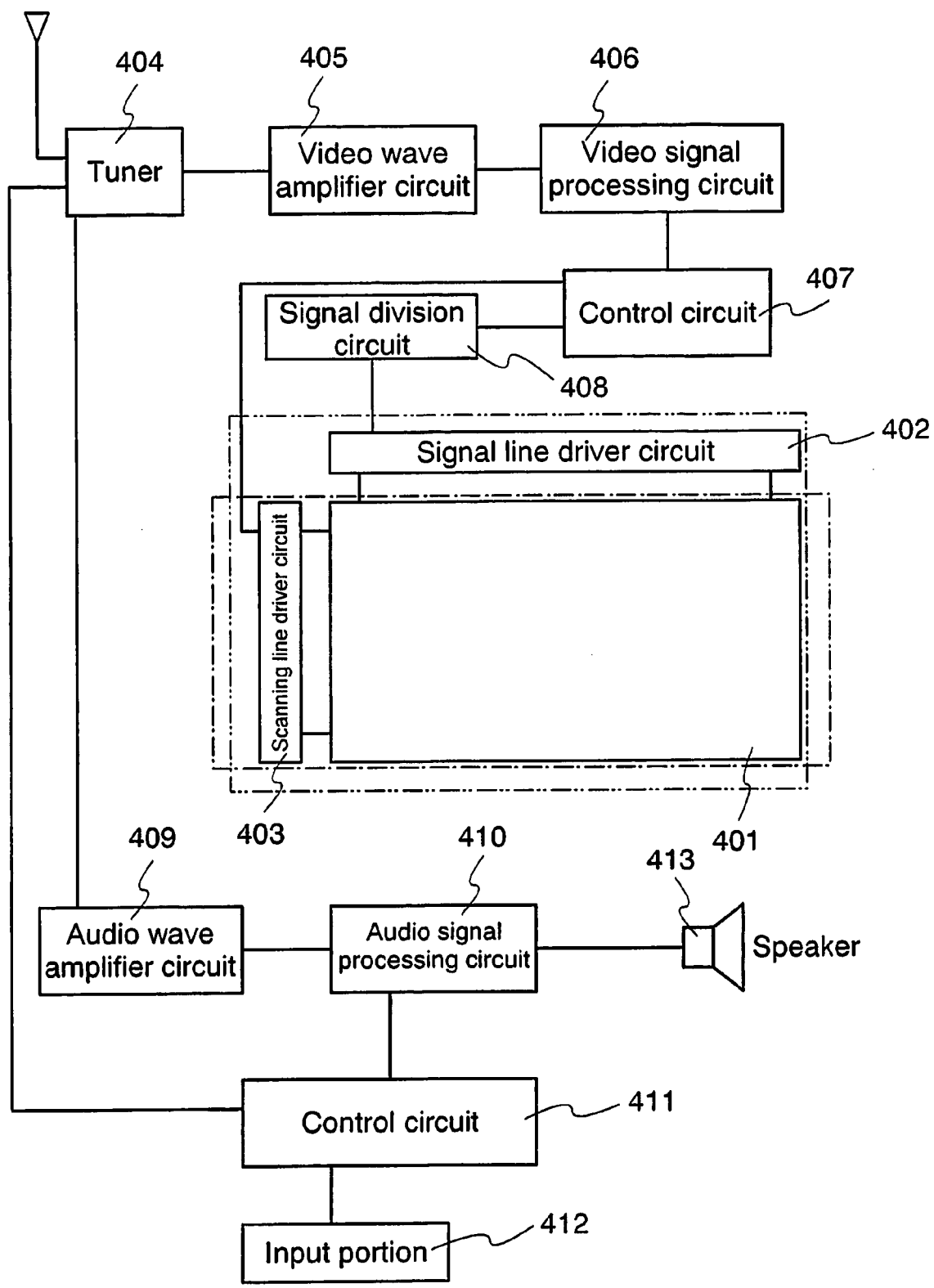
FIG. 23 shows a block diagram of a main structure of a liquid crystal television receiver according to the invention.

A liquid crystal display television receiver can be completed by a liquid crystal display panel manufactured by Embodiment Mode 7. FIG. 23 shows a block diagram of a main structure of the liquid crystal display receiver. A liquid crystal display panel can be formed in any manners as follows: in case where only the pixel portion 401 is formed, and then the scanning line driver circuit 403 and the signal line driver circuit 402 are mounted by a TAB method as shown in FIG. 1; the pixel portion 401 and the scanning line driver circuit 403 and the signal line driver circuit 402 which are peripheral thereof are formed by COG method as shown FIG. 2; and in the case where a TFT is formed to include SAS, the pixel portion 401 and the scanning line driver circuit 403 is integrally formed over the substrate, and the signal line driver circuit 402 is separately mounted as a driver IC.

Another structure of an external circuit comprises a video wave amplifier circuit 405 which amplifies a video signal received by a tuner 404; a video signal processing circuit 406 which converts the video signal outputted therefrom into a color signal corresponding to each color of red, green, and blue; a control circuit 407 which converts the video signal into an input specification of a driver IC; and the like. The control circuit 407 outputs the signal into the scanning line side and the signal line side, respectively. In the case of digital driving, a signal division circuit 408 is provided on the signal line side so as to have a structure in which an input digital signal is provided by dividing into m-pieces.

Among a signal received from the tuner 404, an audio signal is transmitted to an audio wave amplifier circuit 409, and the output thereof is provided for a speaker 413 through an audio signal processing circuit 410. A control circuit 411 receives control information of a receiving station (a receiving frequency) or sound volume from an input portion 412 and transmits the signal to the tuner 404 or the audio signal processing circuit 410.

Figure 24:
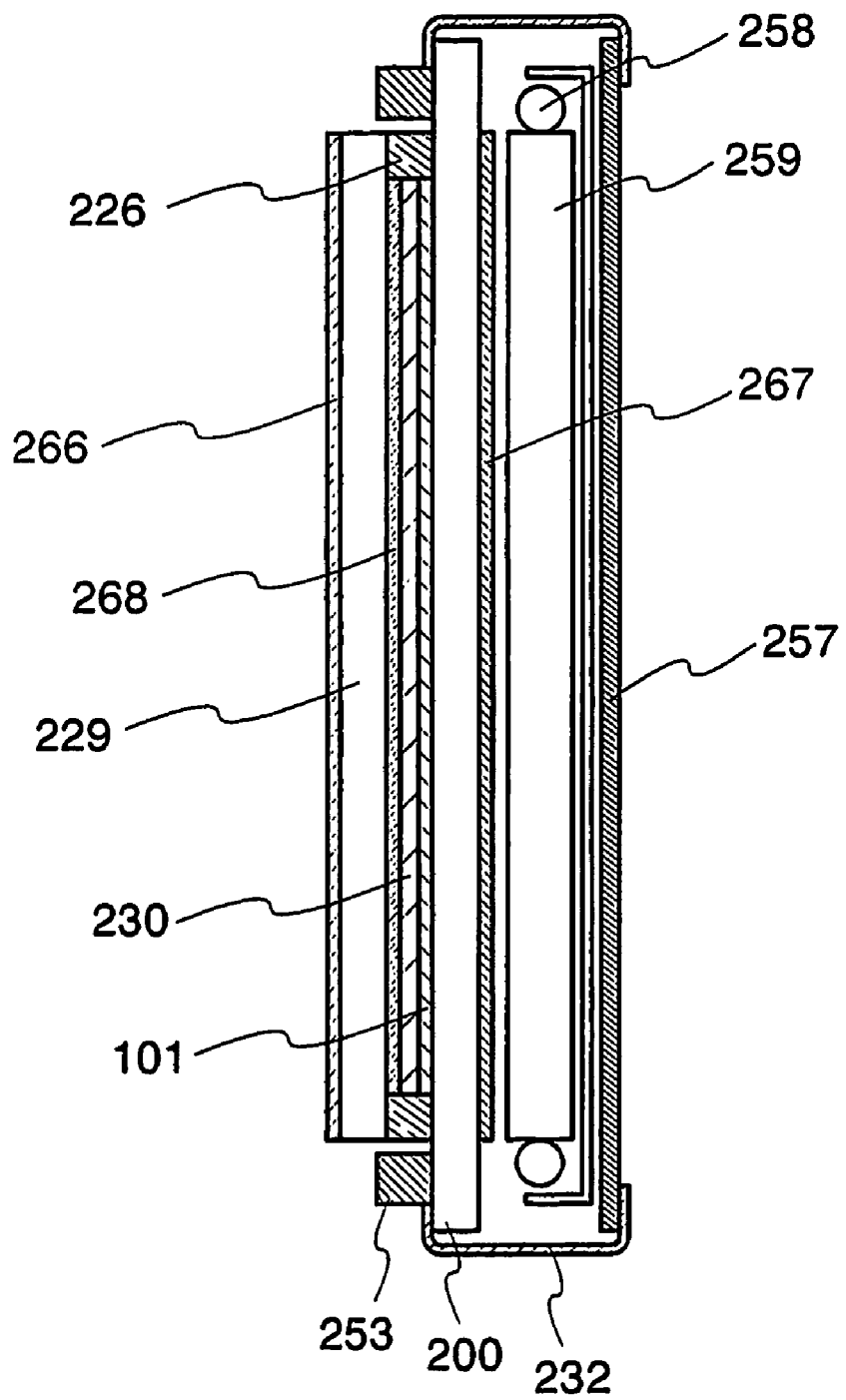
FIG. 24 shows a view illustrating a structure of a liquid crystal display module according to the invention.

FIG. 24 is an example of a liquid crystal display module. A TFT substrate 200 and an opposite substrate 229 are fixed by a sealant 226, and a pixel portion 101 and a liquid crystal layer 230 are provided therebetween to form a display region. A colored layer 268 is needed in carrying out color display. In the case of RGB system, the colored layer 268 corresponding to each color of red, green, and blue is provided corresponding to each pixel. Polarizing plates 266 and 267 are provided outside of the TFT substrate 200 and the opposite substrate 229. Light source is composed of a cold cathode tube 258 and a light conducting plate 259, and a circuit board 257 is connected to the TFT substrate 200 by a wiring board 232 and an external circuit such as a control circuit or a power supply circuit are incorporated.

Figure 25:
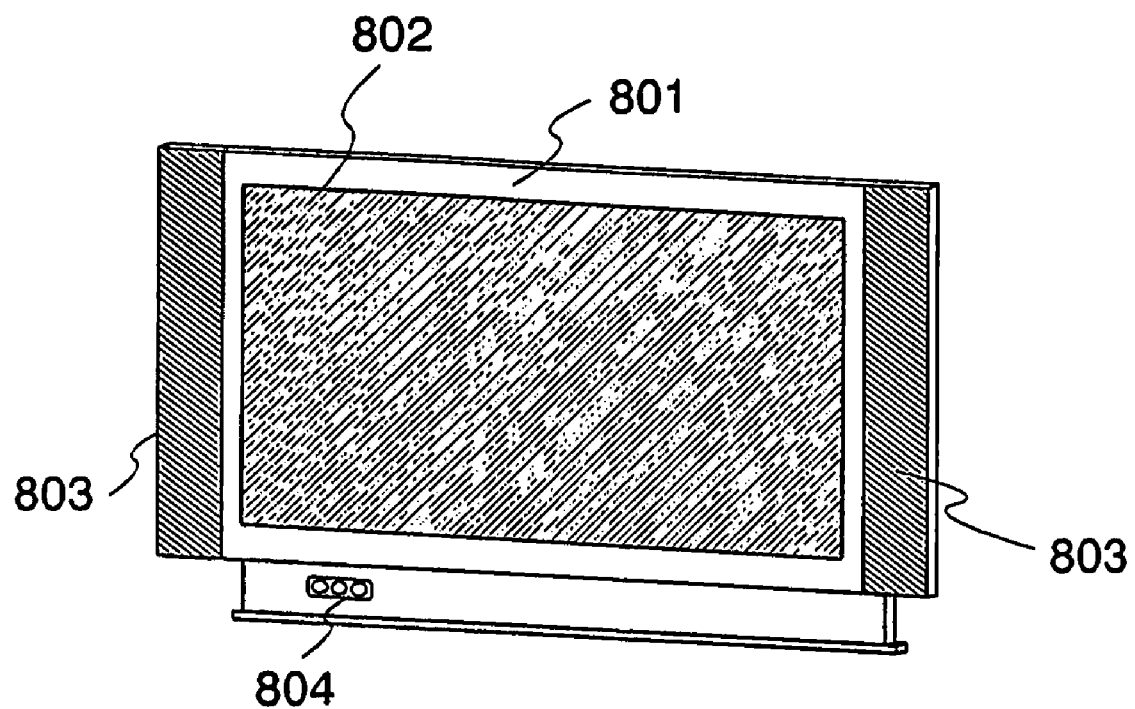
FIG. 25 shows a view illustrating a structure of a television receiver to be completed according to the invention.

FIG. 25 shows the television receiver completed by incorporating this liquid crystal display module into a casing 801. A display screen 802 is formed by the liquid crystal display module and provided a speaker 803, operation switches 804, and the like as other attached equipment. Accordingly, the television receiver can be completed according to the present invention.

Of course, the invention is not limited to the television receiver and is applicable to a display medium with a large-sized area such as an information display board at a station, an airport, or the like, or an advertisement display board on the street as well as a monitor of a personal computer.

This application is based on Japanese Patent Application serial no. 2003-368166 filed in Japan Patent Office on 28 Oct., 2003, the contents of which are hereby incorporated by reference.

Although the invention has been fully described by way of Embodiment Modes and with reference to the accompanying drawings, it is to be understood that various changes and modifications will be apparent to those skilled in the art. Therefore, unless such changes and modifications depart from the scope of the invention hereinafter defined, they should be constructed as being included therein.

EXPLANATION OF REFERENCE

100 Substrate
101 Pixel portion
102 Pixel
103 Scanning line input terminal
104 Signal line input terminal
105 Scanning line driver IC
106 Signal line driver IC
107 Scanning line driver circuit
108 Protective circuit
200 TFT substrate
201 Conductive layer
202 Wiring
203 Gate electrode
204 Capacitor wiring
205 Insulating layer
207 Gate insulating layer
208 First insulating layer
209 Second insulating layer
210 Third insulating layer
211 Semiconductor layer
212 Insulating layer
213 Mask
214 Insulating layer
215 N-type semiconductor layer
216 Mask
217 Semiconductor layer
218 N-type semiconductor layer
219 Wiring
220 Wiring
221 Wiring
222 N-type semiconductor layer
223 N-type semiconductor layer
224 First electrode
225 Insulating layer
226 Sealant
227 Insulating layer
228 Second electrode
229 Opposite substrate
230 Liquid crystal layer
232 Wiring board
233 Switching TFT
234 Capacitor element
235 Connection wiring
236 Connection wiring
237 Connection wiring
238 Connection wiring
240 Insulating layer
241 Opening
242 Opening
244 Alignment film
250 Gate electrode
251 Semiconductor layer
252 Insulating layer for channel protection
253 Wiring
254 Common potential line
255 Common potential line
256 Wiring
257 Circuit board
258 Cold cathode tube
259 Light conducting plate
260 TFT
261 Protective diode
262 Protective diode
263 Protective diode
264 Protective diode
265 Capacitor element
266 Polarizing plate
267 Polarizing plate
268 Colored layer
270 Capacitor wiring
271 Wiring
272 Wiring
273 Wiring
274 First electrode
276 N-type semiconductor layer
277 N-type semiconductor layer
278 Semiconductor layer
279 Gate electrode
291 Switching TFT
293 Capacitor portion
301 N-type semiconductor layer
302 Mask
303 Semiconductor layer
304 N-type semiconductor layer
305 Wiring
306 Wiring
307 N-type semiconductor layer
308 N-type semiconductor layer
309 Semiconductor layer
310 First electrode
311 Insulating layer
312 Sealant
313 Alignment film
314 Opposite electrode
315 Substrate
316 Liquid crystal layer
317 Connection terminal
401 Pixel portion
402 Signal line driver circuit
403 Scanning line driver circuit 404 Tuner
405 Video wave amplifier circuit
406 Video signal processing circuit
407 Control circuit
408 Signal division circuit
409 Audio wave amplifier circuit
410 Audio signal processing circuit
411 Control circuit
412 Input portion
413 Speaker
500 Pulse output circuit
501 Buffer circuit
502 Pixel
601 N-channel type TFT
602 N-channel type TFT
603 N-channel type TFT
604 N-channel type TFT
605 N-channel type TFT
606 N-channel type TFT
607 N-channel type TFT
608 N-channel type TFT
609 N-channel type TFT
610 N-channel type TFT
611 N-channel type TFT
612 N-channel type TFT
613 N-channel type TFT
620 N-channel type TFT
621 N-channel type TFT
622 N-channel type TFT
623 N-channel type TFT
624 N-channel type TFT
625 N-channel type TFT
626 N-channel type TFT
627 N-channel type TFT
628 N-channel type TFT
629 N-channel type TFT
630 N-channel type TFT
631 N-channel type TFT
632 N-channel type TFT
633 N-channel type TFT
634 N-channel type TFT
635 N-channel type TFT
801 Casing
802 Display screen
803 Speaker
804 Operation switch
1001 Substrate
1002 Pixel portion
1003 Scanning line driver circuit
1004 Scanning line driver circuit
1005 Mother substrate
1006 Flexible wiring
1007 Driver IC
1008 Large-sized substrate
1009 Flexible wiring
1010 Driver IC
1401 Droplet discharge means
1402 Imaging means
1403 Head
1404 Control means
1405 Recording medium
1406 Image processing means
1407 Computer
1408 Marker

The invention claimed is:

1. A liquid crystal display device comprising:
a pair of substrates;
a liquid crystal interposed between the pair of substrates;
a thin film transistor over one of the pair of substrates; and
a pixel electrode connected to the thin film transistor,
wherein the thin film transistor comprises:
a gate electrode comprising a chained metal body of nanoparticles over the one of the pair of substrates,
a first layer including at least one of silicon nitride and silicon nitride oxide formed on and in direct contact with the gate electrode,
a gate insulating layer at least comprising a second layer including silicon oxide over the first layer, and
a semiconductor layer over the gate insulating layer.

2. A liquid crystal display device comprising:
a pair of substrates;
a liquid crystal interposed between the pair of substrates;
a thin film transistor over one of the pair of substrates; and
a pixel electrode connected to the thin film transistor,
wherein the thin film transistor comprises:
a gate electrode comprising a chained metal body of nanoparticles over the one of the pair of substrates,
a first layer including at least one of silicon nitride and silicon nitride oxide formed on and in direct contact with the gate electrode,
a gate insulating layer at least comprising a second layer including silicon oxide over the first layer,
a semiconductor layer over the gate insulating layer;
a wiring connected to at least one of a source and a drain; and
a third layer including at least one of silicon nitride and silicon oxide formed on and in direct contact with the wiring,
wherein the wiring comprises a chained metal body of nanoparticles.

3. A liquid crystal display device comprising:
a pair of substrates;
a liquid crystal interposed between the pair of substrates;
a first thin film transistor over one of the pair of substrates;
a pixel electrode connected to the first thin film transistor;
a driver circuit constructed by a second thin film transistor which comprises the same layer structure as the first thin film transistor; and
a wiring extending from the driver circuit and connected to a gate electrode of the first thin film transistor,
wherein the first thin film transistor comprises:
the gate electrode comprising a chained metal body of nanoparticles over the one of the pair of substrates,
a first layer including at least one of silicon nitride and silicon nitride oxide formed on and in direct contact with the gate electrode,
a gate insulating layer at least comprising a second layer including silicon oxide over the first layer, and
a semiconductor layer over the gate insulating layer.

4. A liquid crystal display device comprising:
a pair of substrates;
a liquid crystal interposed between the pair of substrates;
a first thin film transistor over one of the pair of substrates;
a pixel electrode connected to the first thin film transistor;
a driver circuit constructed by a second thin film transistor which comprises the same layer structure as the first thin film transistor; and
a first wiring extending from the driver circuit and connected to a gate electrode of the first thin film transistor,
wherein the first thin film transistor comprises:

the gate electrode comprising a chained metal body of nanoparticles over the one of the pair of substrates, a first layer including at least one of silicon nitride and silicon nitride oxide formed on and in direct contact with the gate electrode, a gate insulating layer at least comprising a second layer including silicon oxide over the first layer, a semiconductor layer over the gate insulating layer;

a second wiring connected to at least one of a source and a drain; and a third layer including at least one of silicon nitride and silicon oxide formed on and in direct contact with the second wiring, wherein the second wiring comprises a chained metal body of nanoparticles.

5. The liquid crystal display device according to any one of claims 1 to 4, wherein the chained metal body of nanoparticles comprises Ag.

6. The liquid crystal display device according to any one of claims 1 to 4, wherein the semiconductor layer comprises at least one of hydrogen and halogen; and wherein the semiconductor layer is a semi-amorphous semiconductor having a crystal structure.

7. The liquid crystal display device according to claim 3 or 4, wherein the driver circuit comprises only an n-channel type thin film transistor.

8. The liquid crystal display device according to claim 1 or 2, wherein the semiconductor layer includes hydrogen and halogen, wherein the semiconductor layer has a crystal structure, and wherein the thin film transistor is capable of being operated in electric field effect mobility of from 1 $cm^2$/V·sec to 15 $cm^2$/V·sec.

9. The liquid crystal display device according to claim 3 or 4, wherein each of the semiconductor layer of the first thin film transistor and a semiconductor layer of the second thin film transistor includes hydrogen and halogen, wherein each of the semiconductor layer of the first thin film transistor and the semiconductor layer of the second thin film transistor has a crystal structure, and wherein the first thin film transistor and the second thin film transistor are capable of being operated in electric field effect mobility of from 1 $cm^2$/V·sec to 15 $cm^2$/V·sec.

10. A liquid crystal television receiver comprising the liquid crystal display device according to any one of claims 1 to 4.

11. A method for manufacturing a liquid crystal display device comprising the steps of:

forming a gate electrode comprising a chained metal body of nanoparticles over a substrate having an insulating surface;

laminating a gate insulating layer, a semiconductor layer, and an insulating layer over the gate electrode;

forming a first mask in a position overlapping with the gate electrode with a droplet discharge method;

forming a channel protective layer by etching the insulating layer by using the first mask;

forming a semiconductor layer containing one conductivity type impurity;

forming a second mask in a region including the gate electrode with a droplet discharge method;

etching the semiconductor layer containing one conductivity type impurity and the semiconductor layer by using the second mask;

forming source and drain wirings with a droplet discharge method; and etching the semiconductor layer containing one conductivity type impurity over the channel protective layer by using the source and drain wirings as masks.

12. A method for manufacturing a liquid crystal display device comprising the steps of:

forming a gate electrode and a connection wiring each comprising a chained metal body of nanoparticles over a substrate having an insulating surface;

laminating a gate insulating layer, a semiconductor layer, and an insulating layer over the gate electrode;

forming a first mask in a position overlapping with the gate electrode with a droplet discharge method;

forming a channel protective layer by etching the insulating layer by using the first mask;

forming a semiconductor layer containing one conductivity type impurity;

forming a second mask in a region including the gate electrode with a droplet discharge method;

etching the semiconductor layer containing one conductivity type impurity and the semiconductor layer by using the second mask;

partially exposing the connection wiring by selectively etching the gate insulating layer;

forming a source wiring and a drain wiring and connecting at least one of the source wiring and the drain wiring to the connection wiring at the same time; and etching the semiconductor layer containing one conductivity type impurity over the channel protective layer by using the source and drain wirings as masks.

13. The method for manufacturing a liquid crystal display device according to claim 11 or 12, wherein the step of laminating the gate insulating layer, the semiconductor layer, and the insulating layer over the gate electrode is carried out without exposing to the atmosphere.

14. The method for manufacturing a liquid crystal display device according to claim 11 or 12, wherein the gate insulating layer is formed by sequentially laminating a first silicon nitride film, a silicon oxide film, and a second silicon nitride film.

15. The method for manufacturing a liquid crystal display device according to claim 11 or 12, wherein the first mask is formed using a composition containing conductive nanoparticles.

16. The method for manufacturing a liquid crystal display device according to claim 11 or 12, wherein the second mask is formed using a composition containing conductive nanoparticles.

17. The method for manufacturing a liquid crystal display device according to claim 11 or 12, wherein the source and drain wirings are formed using a composition containing conductive nanoparticles.

18. The method for manufacturing a liquid crystal display device according to claim 11, wherein the gate electrode comprising a chained metal body of nanoparticles is formed by discharging a composition containing conductive nanoparticles with a droplet discharge method and drying the composition containing conductive nanoparticles.

19. The method for manufacturing a liquid crystal display device according to claim 12, wherein the gate electrode and the connection wiring each comprising a chained metal body of nanoparticles are formed by discharging a composition containing conductive nanoparticles with a droplet discharge method and drying the composition containing conductive nanoparticles.

20. The method for manufacturing a liquid crystal display device according to claim 18 or 19, wherein average particle size of the conductive nanoparticles is from 5 nm to 10 nm.

* * * * *